(12) United States Patent
Cowley et al.

(10) Patent No.: US 6,448,556 B1
(45) Date of Patent: Sep. 10, 2002

(54) ATOMIC FOCUSERS IN ELECTRON MICROSCOPY

(75) Inventors: John M. Cowley; John C. H. Spence, both of Tempe, AZ (US); Valery V. Smirnov, St. Petersburg (RU)

(73) Assignee: Arizona State University, Tempe, AZ (US)

( * ) Notice: Subject to any disclaimer, the term of this patent is extended or adjusted under 35 U.S.C. 154(b) by 0 days.

(21) Appl. No.: 09/645,999

(22) Filed: Jun. 14, 1999

Related U.S. Application Data

(60) Provisional application No. 60/039,280, filed on Feb. 28, 1997.

(51) Int. Cl.[7] .......................... H01J 37/12; H01J 37/28
(52) U.S. Cl. ................................ 250/311; 250/396 R
(58) Field of Search .............................. 250/311, 396 R

(56) References Cited

U.S. PATENT DOCUMENTS 5,304,801 A * 4/1994 Arai ........................... 250/311
5,475,218 A * 12/1995 Kakibayashi et al. ....... 250/311

FOREIGN PATENT DOCUMENTS

WO    WO-98/38669 A1 *  9/1998

* cited by examiner

*Primary Examiner*—Jack Berman
(74) *Attorney, Agent, or Firm*—Pitney, Hardin, Kipp & Szuch LLP

(57) ABSTRACT

In electron microscopy, resolution is improved by using an atom or atom-array focuser, with the atom or atom array serving as an electrostatic lens at a focal plane of an electron beam probe having a beam size less than about 0.2 nm at the focal plane. An electrostatic lens can be included in ultra-high resolution microscopes wherein (i) in a linear atom array, the atoms are in alignment with the electron path, (ii) the distance between a sample and the electrostatic lens is adjustable, (iii) a two-dimensional focuser is used, (iv) a sample is at Fourier image distance from a two-dimensionally periodic focuser, (v) a two-dimensional detector or detector array is used, and/or (vi) the electron beam is scanned at the focal plane.

14 Claims, 29 Drawing Sheets

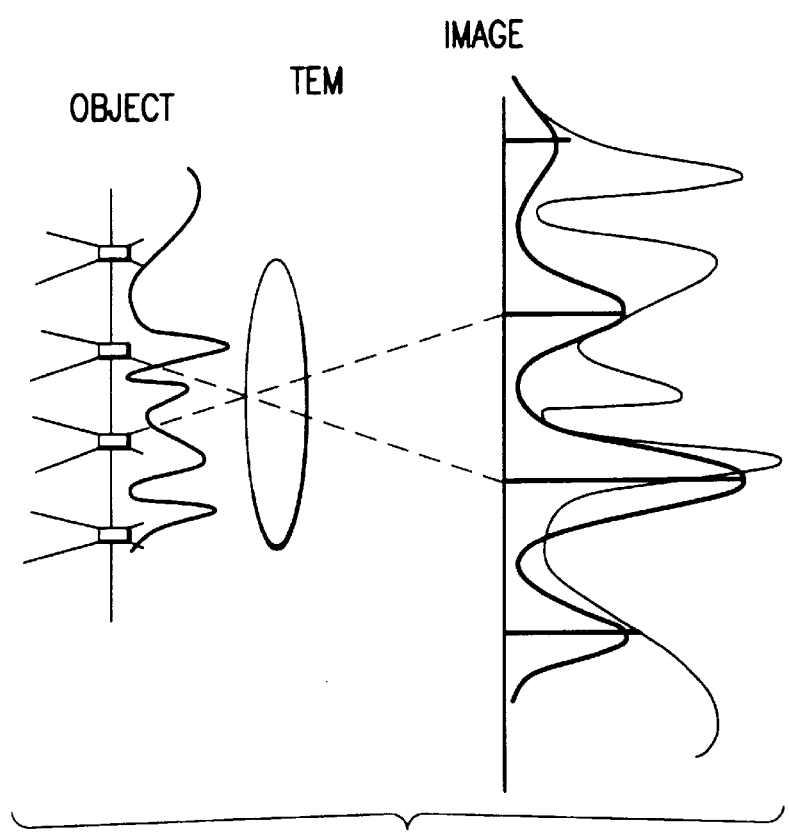
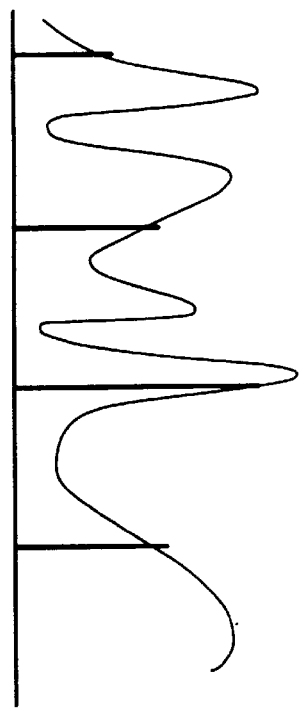
FIG.11A  FIG.11B
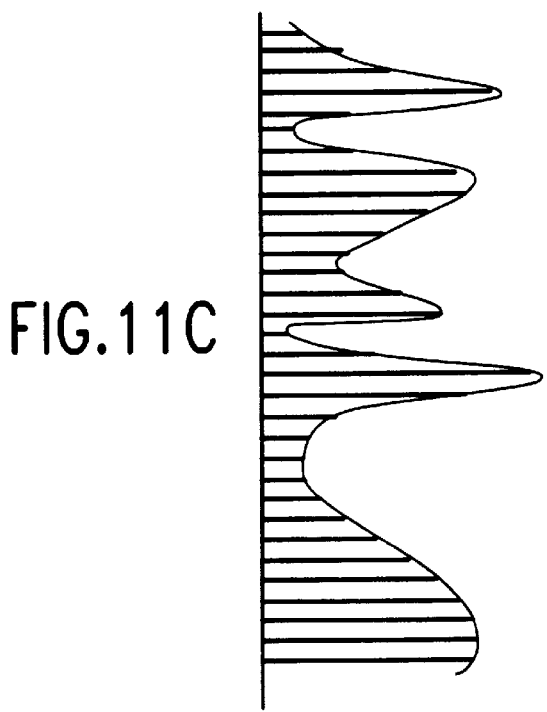
FIG.11C

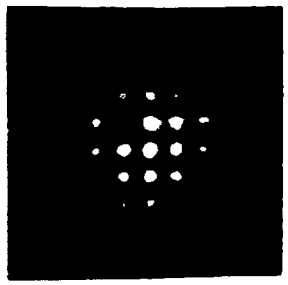
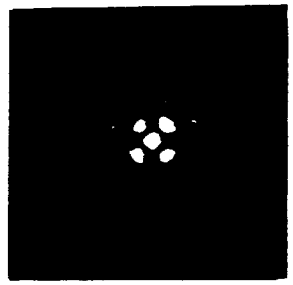
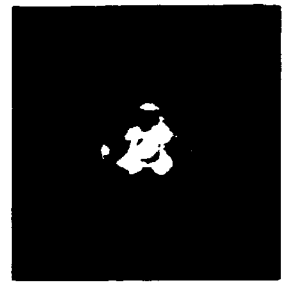
FIG.16A          FIG.16B          FIG.16C
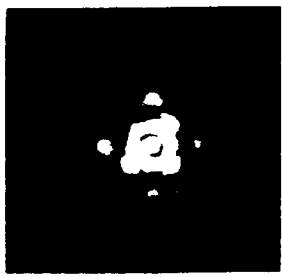
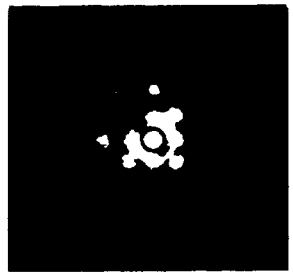
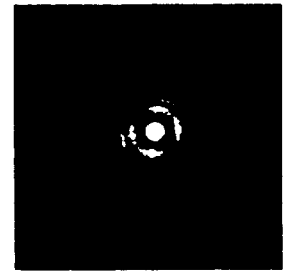
FIG.16D          FIG.16E          FIG.16F
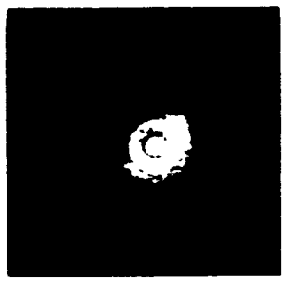
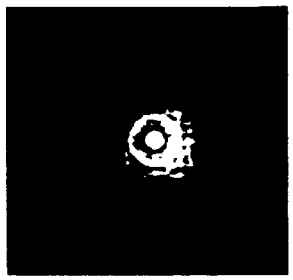
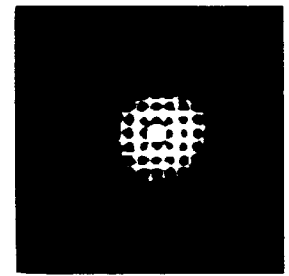
FIG.16G          FIG.16H          FIG.16I

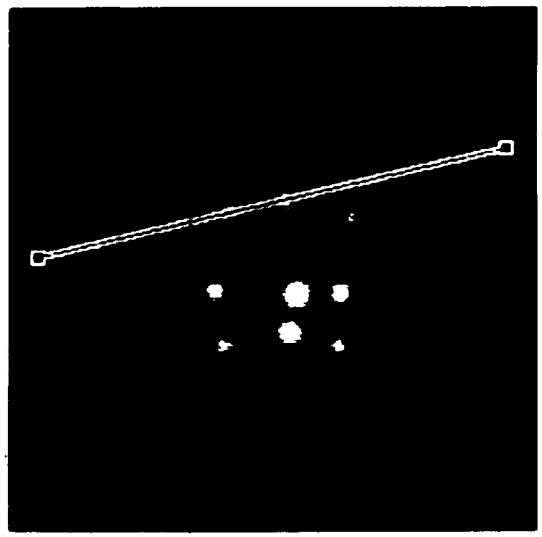
FIG.17A
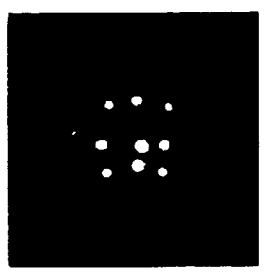  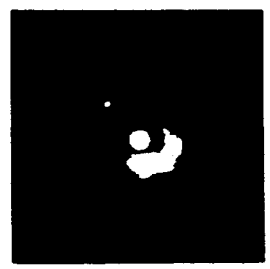
FIG.17B	FIG.17C	FIG.17D

ATOMIC FOCUSERS IN ELECTRON MICROSCOPY

Priority is claimed based on U.S. Provisional Application No. 60/039,280, filed Feb. 28, 1997 and incorporated herein by reference.

TECHNICAL FIELD

This invention relates to utilizing the electrostatic field of a single heavy atom, or of a row of atoms extending through a thin crystal, as a lens for focusing a high-energy electron beam. Such "atomic focusers", having focal lengths of a few nanometers, may be incorporated in the electron-optical systems of electron microscopes so as to give a considerable enhancement of the electron microscope resolution.

BACKGROUND OF THE INVENTION

The electrostatic field of an isolated atom is the positive field of the nucleus, screened by the electron cloud, and so is a smoothly decreasing positive potential which can deflect a charged-particle beam. For negative particles it can act as a positive, convergent, lens and for positive particles it can act as a negative, divergent lens. In order to be effective and useful, the position of the atom lens must not vary, i.e., it should not be moveable. One way of insuring that is the case is by holding the atom lens firmly in place by bonding it to other atoms of a solid. However, in that case the electrostatic field then ceases to decrease smoothly for distances greater than, typically, 0.1 to 0.2 nm. The atom-lens, or atomic focuser, must then be used in conjunction with an associated particle-optics device capable of focusing a beam of appreciable intensity down to these dimensions. Currently this can be achieved only for electron beams of reasonably high energy, greater then about 50 keV, by use of electron microscope systems.

The resolution of electron microscopes is currently limited to between 0.1 and 0.2 nm by the unavoidable aberrations of the objective lens. The most important aberration in this respect is the third-order spherical aberration which has a magnitude approximately equal to the focal length of the lens. This presently attainable resolution is sufficient for the imaging of single heavy atoms on suitable light-atom supports and for the imaging of the arrangements of atoms in many crystals when those crystals are held in suitable orientations with the incident electron beam parallel to a principal crystal axis. However, this resolution is not sufficient for the imaging of the atoms in crystals when the crystals have other orientations, desirable for particular purposes, or for some types of crystals even in principal orientations. For many types of investigations, and particularly when it is desired to study the arrangement of atoms in and around crystal defects, or the arrangement of atoms in poorly-ordered solids and in small particles, a resolution limit of 0.05 nm or less is highly desirable.

Resolutions approaching 0.1 nm are now possible only with high-voltage microscopes, operating with an accelerating voltage of 1 MV or more. However, for such high voltages, the high-energy electron beam produces severe radiation damage effects in most materials, making it difficult or impossible to reveal atom positions, especially around crystals defects. It would be most valuable if an improvement of resolution to better than 0.1 nm could be made for microscopes operating with electron energies of 100 keV to 200 keV, for which the radiation damage problem for many materials is much less serious and the current resolution limit is about 0.2 nm, or for microscopes with even lower energies.

One possible means for improving the resolution of electron microscopes is to use lenses of very small focal length and correspondingly small spherical aberration constants. However, it is not feasible to reduce the focal length of the commonly used electromagnetic lenses any further because of the mechanical requirements for the insertion and manipulation of specimens and the limitations on magnetic field strength imposed by the available magnetic materials.

There are several papers in the reported literature which incorporate the idea that high-resolution images of arrangements of atoms may be achieved by taking advantage of the fact that electrons may be concentrated into beams of very small diameter by transmission through thin crystals. These papers refer to the channeling of electrons through crystal lattices which gives a concentrated fine beam of electrons at each atom position of the exit face of the crystal and allow, in effect, a high-resolution imaging of atoms attached to the exit face. In a series of papers, J. T. Fourie, 90 Optik, 37, 85 and 134 (1992), and 95 Optik 128 (1994), Fourie proposed, incorrectly, that the channeling effect creates concentrations of electrons between the atom rows and gave examples of high-resolution detail of a layer of atoms sitting on the exit face of a gold crystal. Loane et al. in "Visibility of Single Heavy Atoms on Thin Crystalline Silicon in Simulated Annular Dark-Field STEM Images," A44 Acta Cryst. 912–927 (1988) which is incorporated herein by reference, correctly described the channeling of electrons as being along the row of atoms in a crystal and calculated the intensities for the high-resolution images of gold atoms sitting on the exit face of a silicon crystal. None of these papers describe or suggest the use of the atoms as a lens to form small cross-overs at a distance beyond the exit face of a crystal.

SUMMARY OF THE INVENTION

Accordingly, it is an object of the present invention to improve the resolution of electron microscopes.

Another object of the invention is to provide a method for focusing an electron beam.

A further object of the invention is to provide an electrostatic lens using the electrostatic potential of an atom or atom array to focus an electron beam.

These and other objects are achieved by the present invention, which provides a method of focusing an electron beam comprising forming an electron beam probe having a beam size less than about 0.2 nm at a focal plane, and focusing the electron beam probe using a fixed atom or atom array focuser having sufficient electrostatic field at the focal plane whereby the fixed atom or atom array acts an electrostatic lens. Preferred for such focusing are heavier atoms, of elements having atomic number greater than about 20.

Included are the following schemes, techniques or configurations for an ultra-high resolution electron microscope:

(1) an electrostatic lens device comprising a fixed atom or linear atom array disposed at a focal plane of an electron beam probe having a diameter of less than about 0.2 nm at the focal plane; as well as an ultra-high resolution microscope comprising an electron beam generator for generating a beam having an energy greater than about 50 keV, an electron beam focuser for focusing the beam to about less than 0.2 nm at a focal plane, an electrostatic lens comprising a fixed atom or atom array placed in the electron beam at the focal plane, a sample holder for holding a sample in the electron beam after the electrostatic lens at a distance from the electrostatic lens which can be varied by a suitable distance adjuster device, and a detector for detecting the electron beam after passing through the sample;

(2) an ultra-high resolution microscope comprising an electron beam generator for generating an electron beam having an energy greater than about 50 keV, similar to the illumination system of a conventional transmission electron microscope, for illuminating a sample, an electrostatic lens comprising an atom or linear array of atoms aligned in the incident beam direction, a device for varying the distance between the sample and the electrostatic lens, and a dectector having a resolution limit not exceeding about 0.2 nm;

(3) an ultra-high resolution electron microscope comprising an electron beam generator for generating an electron beam having an energy greater than about 50 keV and a divergence of less than about 1 mrad, a thin crystal forming a two-dimensionally periodic electrostatic focuser, a sample holder for holding a sample in the electron beam at a Fourier image distance from the periodic electrostatic lens, a device for translating the Fourier image of the periodic electrostatic lens relative to the sample, and a detector device having a resolution limit not greater than about 0.2 nm;

(4) an ultra-high resolution electron microscope comprising an electron beam generator for generating an electron beam having an energy greater than about 50 keV, an electron beam focuser for focusing the beam to a diameter less than about 0.2 nm, a sample holder for holding a sample in the electron beam at the focal plane, a thin single crystal forming a two-dimensionally periodic electrostatic focuser for placement at a distance from the sample equal to a Fourier image distance for the periodic focuser, and a two-dimensional detector or detector array for detecting electron beam after it has passed through the periodic electrostatic focuser;

(5) an ultra-high resolution electron microscope comprising an electron beam generator for generating an electron beam having an energy greater than about 50 keV, an electron beam focuser for focusing the beam to about less than 0.2 nm diameter at a focal plane, a device for laterally scanning the beam at the focal plane in two dimensions, a sample holding for holding a sample in the focal plane of the focuser, a thin crystal forming a two-dimensionally periodic array of electron focusers, and a detector system having a resolution limit which is greater than 0.2 nm and which may be as great as 10 nm;

(6) an uitra-high resolution electron microscope comprising an electron beam generator for generating an electron beam of energy greater than about 50 keV, an electron beam focuser for focusing the electron beam to a diameter of less than about 1 nm at a focal plane, a device for scanning the beam at the focal plane in two dimensions, a thin crystal forming a two-dimensionally periodic array of electrostatic lenses, a sample holder for holding a sample within a distance of a few nanometers after the two-dimensional electrostatic focuser array, and a detector system having a resolution limit not greater than a bout 0.2 nm.

BRIEF DESCRIPTION OF THE DRAWING

FIGS. 11(a)–11(c) are diagrams illustrating the crystal focuser TEM scheme (Scheme 3).

FIGS. 16(a)–16(i) are images calculated for an atomic focuser in an Au[001] crystal, 0.41 nm thick (Scheme 5). FIG. 16(a) represents the projected potential of the specimen, modulated by a gaussian of width 0.14 nm. FIG. 16(b)–16(i) are images at infinity for specimen-to-focuser distances of 1.4, 1.6, 1.8, 2.0, 2.5, 4.1, 5.7 and 7.1 nm, respectively. Note the reversal of contrast between FIGS. 16(d) and 16(e).

FIGS. 17(a)–17(d) are simulated images for a randomized model, Scheme 5. FIG. 17(a) shows the projected potential, modulated by a gaussian, showing the line of scan used for the plots of FIGS. 18(a)–18(c). FIG. 17(b) shows the same on a smaller scale. FIGS. 17(c) and 17(d) correspond to under-focus and over-focus conditions, respectively.

DETAILED DESCRIPTION

1. A Single-atomic Focuser in a STEM Instrument (Scheme 1)

(a) General Principles

In a conventional STEM instrument, electrons from the small source in a field-emission gun are focused by the objective lens to form a probe of diameter about 0.2 nm which is scanned over the specimen. For bright-field imaging, part of the electron beam directly transmitted through the specimen is detected to give a signal which modulates the intensity of the electron beam of a display cathode ray tube as it is scanned in synchronism with the scanning of the beam over the specimen. Darkfield images are produced when all, or some selected portion, of the distribution of electrons scattered outside the incident beam cone is used to form the displayed signal.

Figure 1:
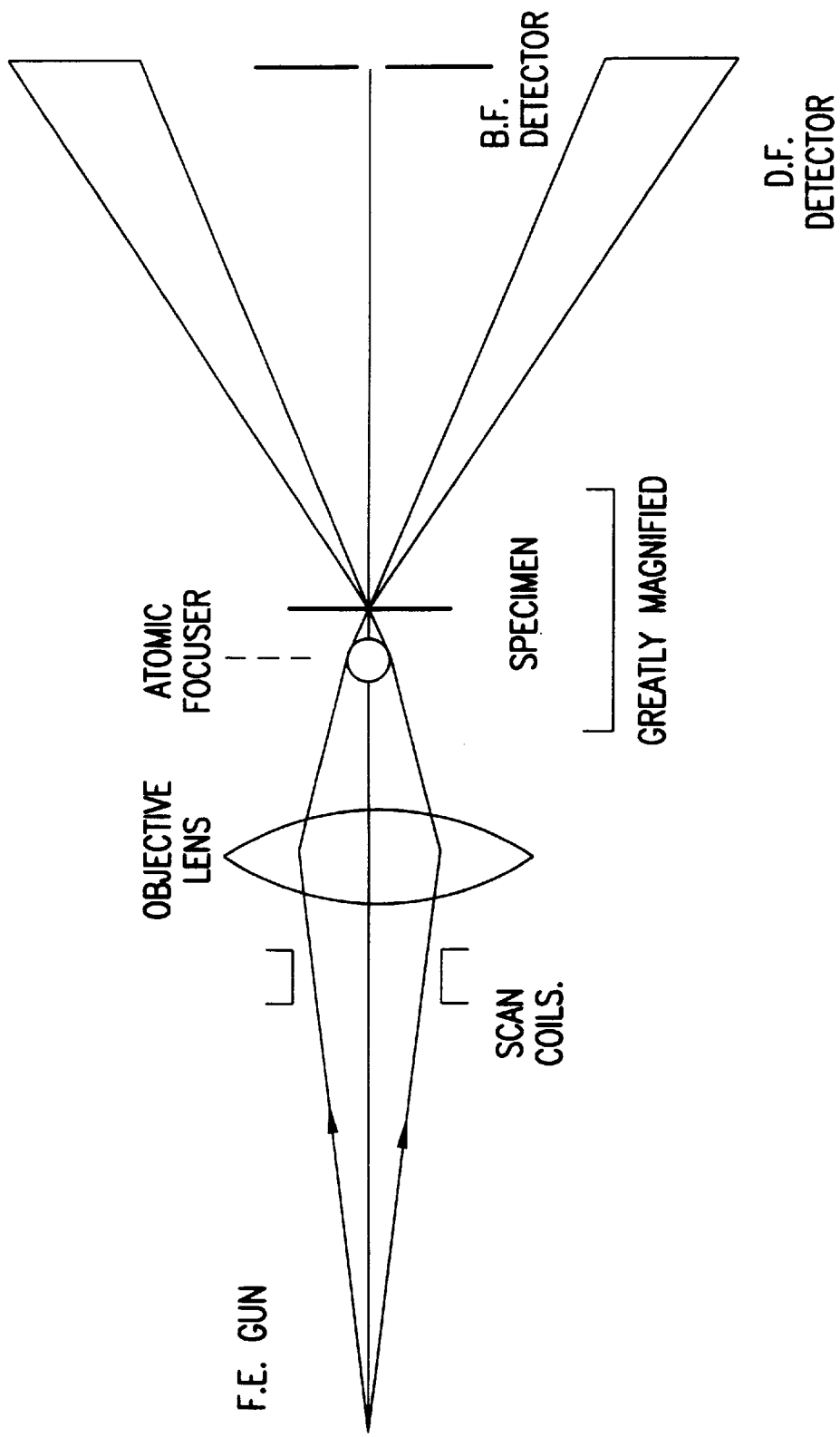
FIG. 1 is a diagrammatic illustration of an atomic focuser for STEM (scanning transmission electron microscopy) in accordance with Scheme 1.

In the present invention, the incident electron probe is focused on a single-atom focuser, as indicated in FIG. 1. The specimen is held at a distance of a few nanometers beyond the focusing atom. In order to establish the correct distance between the atom focuser and the specimen and to scan the reduced electron probe over the specimen, either the specimen or the atom focuser should be mounted on a piezoelectric positioning and scanning system such as used in STM (scanning tunneling microscopy) and related instruments. A bright-field image of the specimen is produced if the detector lies within the cone of radiation formed by scattering from the focuser atom which is the area of high intensity in the detector plane corresponding to the usual diffraction pattern of the atom. Dark-field images of the specimen may be recorded by collecting the electrons scattered to higher angles than the primary scattering of the focuser atom, by use of, for example, a high-angle annular detector system, such as is standard for some STEM imaging modes.

Figure 7A:
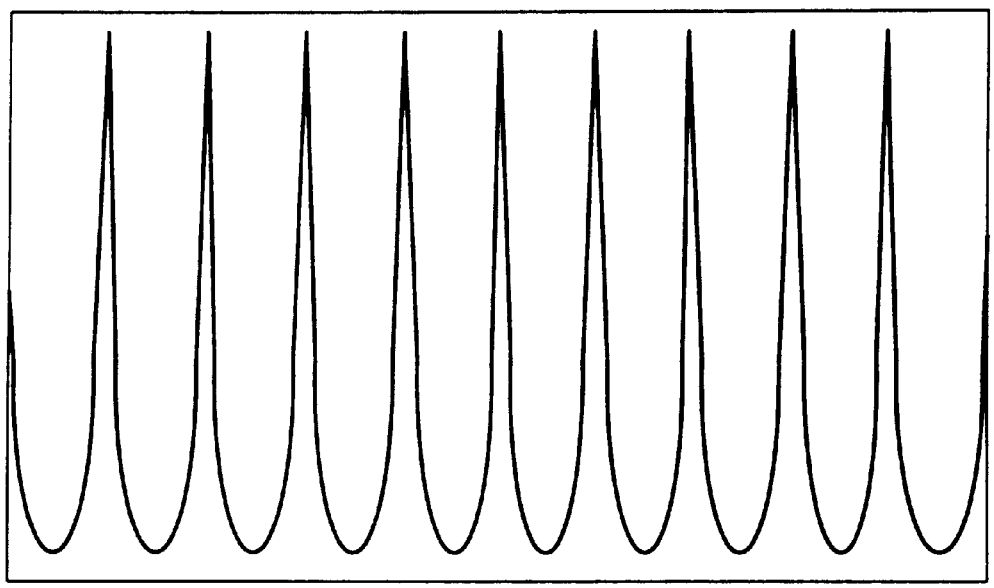
FIG. 7(a) is a graphical representation of the projection of the potential of a layer of gold atoms.
Figure 7B:
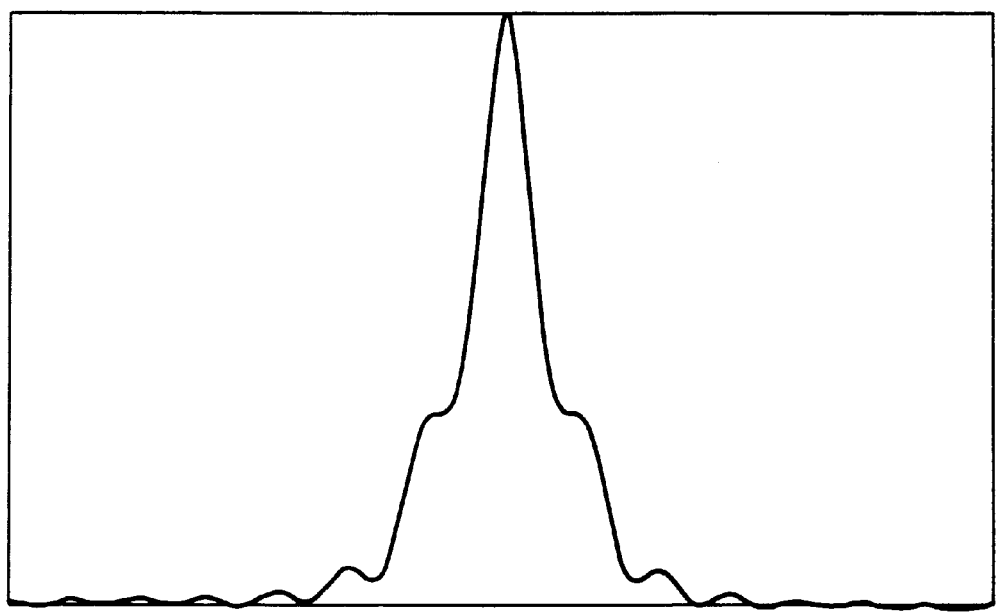
FIG. 7(b) is a graphical representation of the intensity distribution of an incident beam.
Figure 7C:
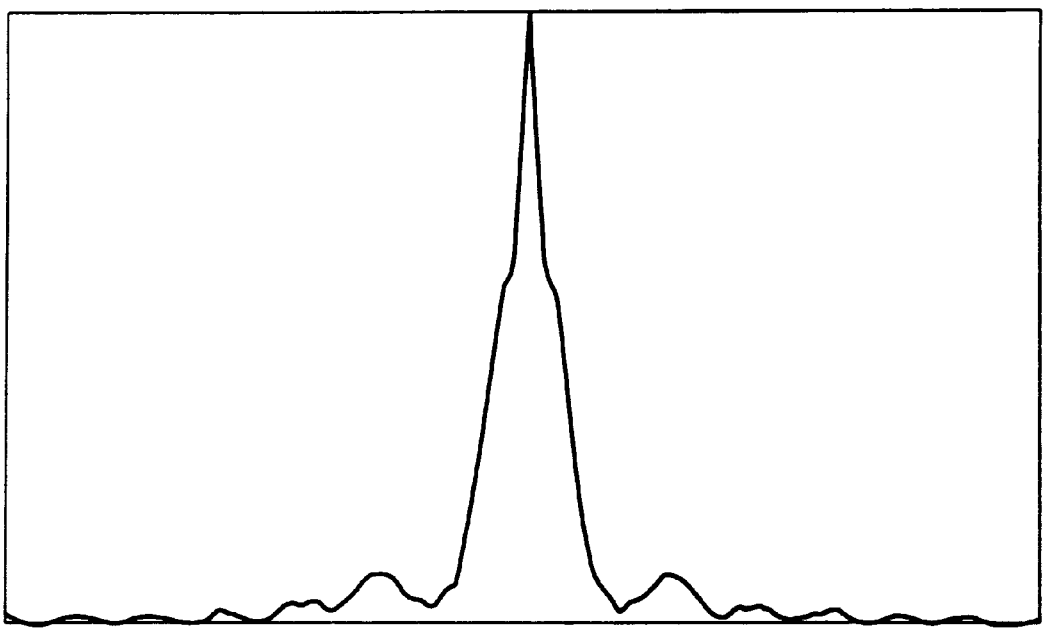
FIGS. 7(c)–7(e) are graphical representations of the intensity distributions of a beam exiting from crystals of different thicknesses.
Figure 7D:
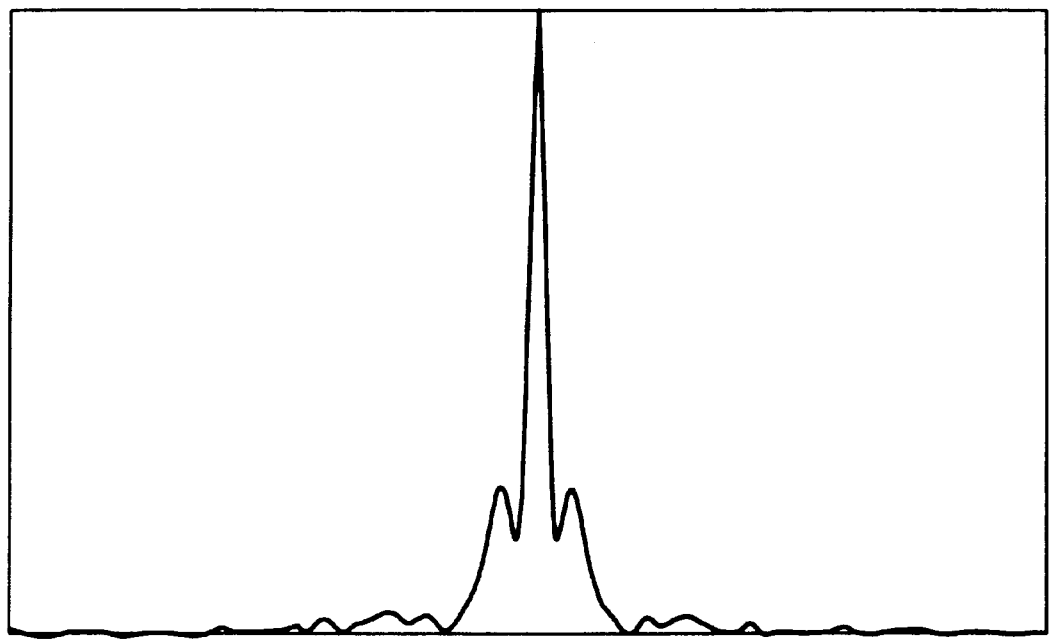
Figure 7E:
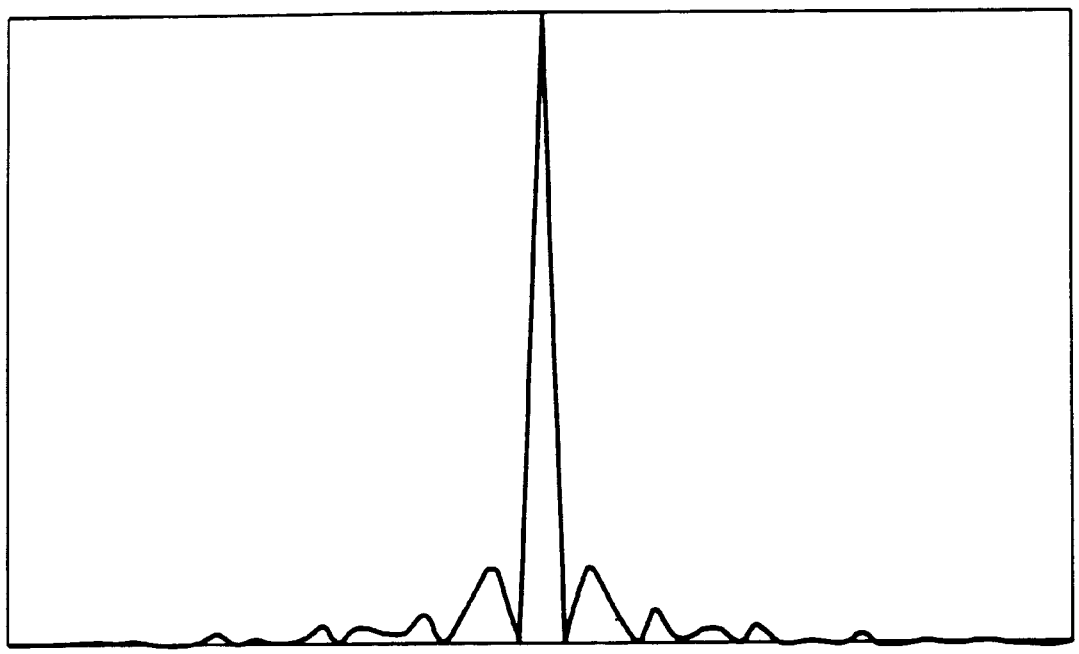
Figure 8:
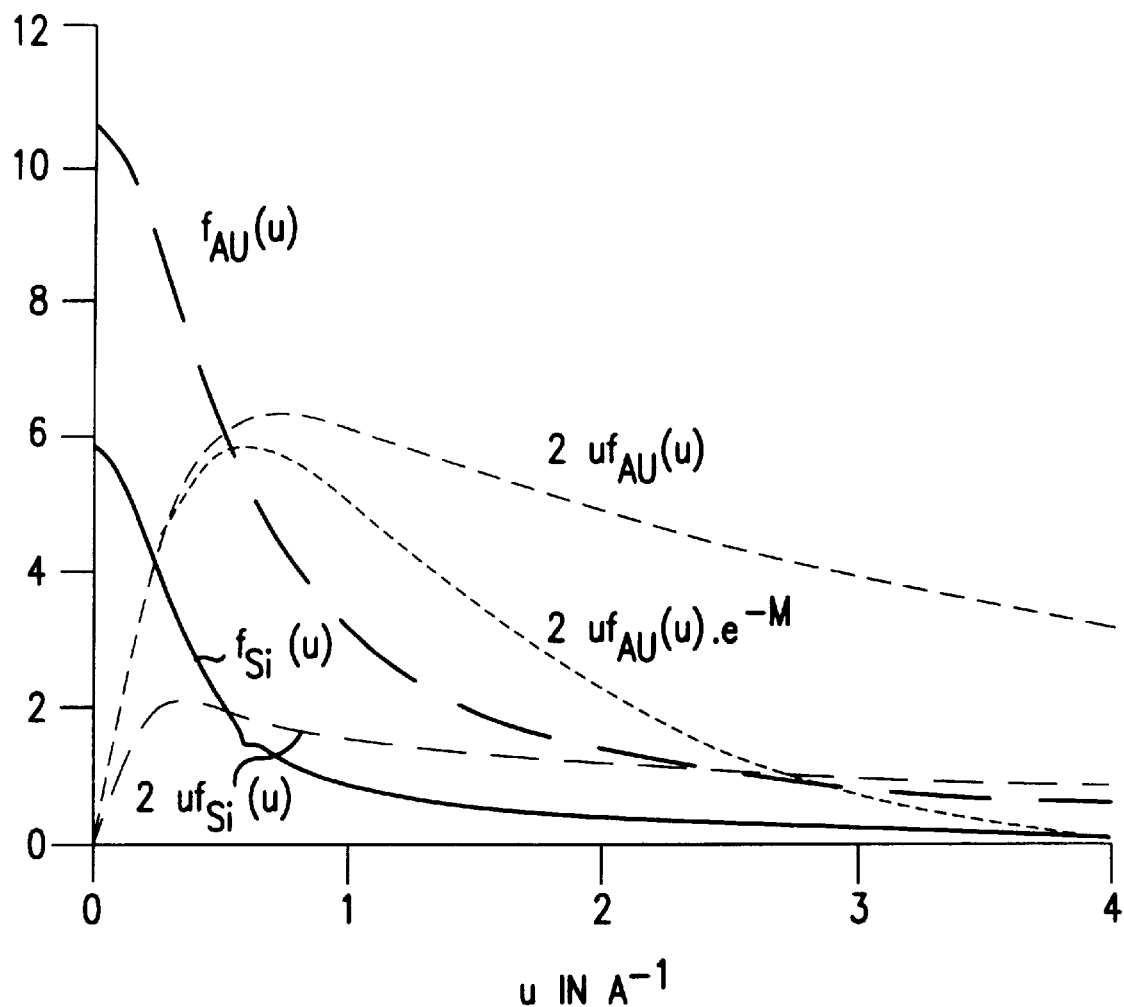
FIG. 8 is a graphical representation of atomic scattering factors in reciprocal space.

In general, it may be noted that the dimensions of the probes, or the resolutions of the images, formed by atomic focusers are approximately the same as the dimensions of the peaks of projected potential of the atoms to be imaged, as can be seen in FIGS. 7(a)–7(e) which are based on 200 KeV electrons focused by an STEM lens having Cs=2 mm and an optimum degree of defocus. The projection of the potential of a layer of gold atoms with periodicity 0.235 nm and with 10 such periods within the superlattice unit cell is shown in FIG. 7(a). The intensity distribution of the incident beam, having a width of 0.2 nm is shown in FIG. 7(b). FIGS. 7(c) to 7(e) show the intensity distributions of the beam at the exit face of the crystal for thicknesses of 4, 10 and 20 layers of gold atoms, corresponding to crystal thicknesses of 1.15, 2.89 and 5.77 nanometers, respectively. In reciprocal space, it may be considered that the radius of the effective aperture of the atomic focuser, considered as a lens, is about 2–3 $\text{Å}^{-1}$. As indicated in FIG. 8, the atomic scattering factors have fallen off to about 0.1 of their maximum values in this range. It may be considered that, because of the two-dimensional nature of the scattering distribution, the total contribution of an atom to an image may more rightly be considered to be proportional to $2\pi u f(u)$, where $|u|=(2 \sin \theta)/\lambda$, and $q\theta$ is half the scattering angle. As seen in FIG. 8, the multiplication by u, especially for heavy elements such as Au, gives much greater emphasis to the high-angle scattering, but this must be modified by the Debye-Waller factor. Also, for a line of atoms through a crystal, the angular extent of the scattering may be increased or decreased by a factor of about 2 by dynamical scattering effects. Hence it may be concluded that the atomic focuser images should include most of the information available from the elastic scattering of electrons by atoms.

The results of a one-dimensional calculations suggest that, for a crystal of suitable thickness, probe sizes of diameter less than 0.5 Å may be formed in this way when one plane of the atoms in a crystal is illuminated by a STEM beam of diameter about 2 Å. Two-dimensional calculations for a STEM beam incident on a gold crystal in various orientations and for a barium crystal in [001] orientation for which the distance between atom positions in projection is 3.5 Å have shown that the wave leaving the crystal exit face for suitable thicknesses is sharply peaked with a diameter of less than 0.5 Å and a very low background, as also found by other authors for various crystals; see J. Fertig, H. Rose, Optik 59 (1981) 407; see R. F. Loane, E. J. Kirkland, Acta Crystal. A44 (1988), 912.

Figure 9B:
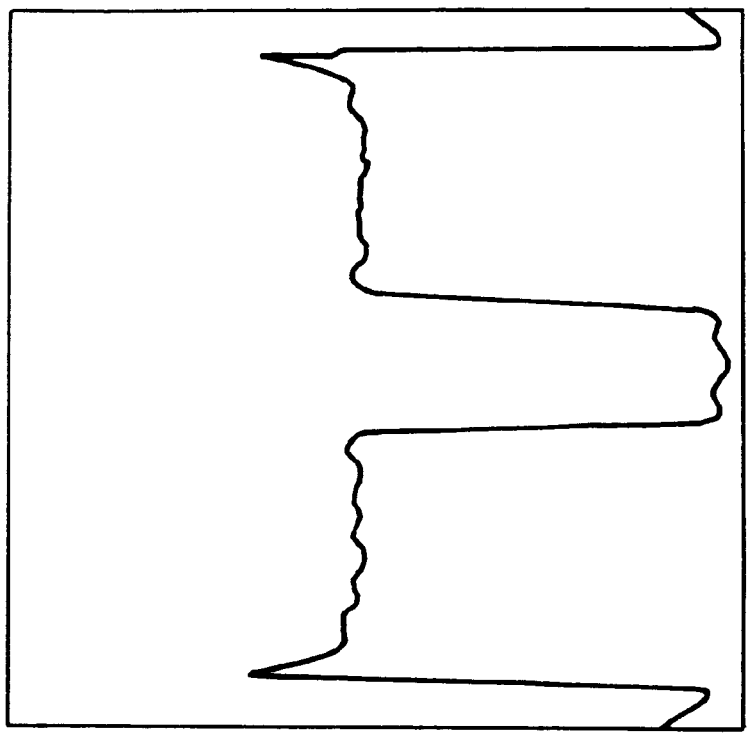
FIGS. 9(a) and 9(b) are graphical representations of amplitude and phase, respectively, of an incident plane wave after its passage through a crystal of gold in [001] orientation, 2.6 nm thick.
Figure 9A:
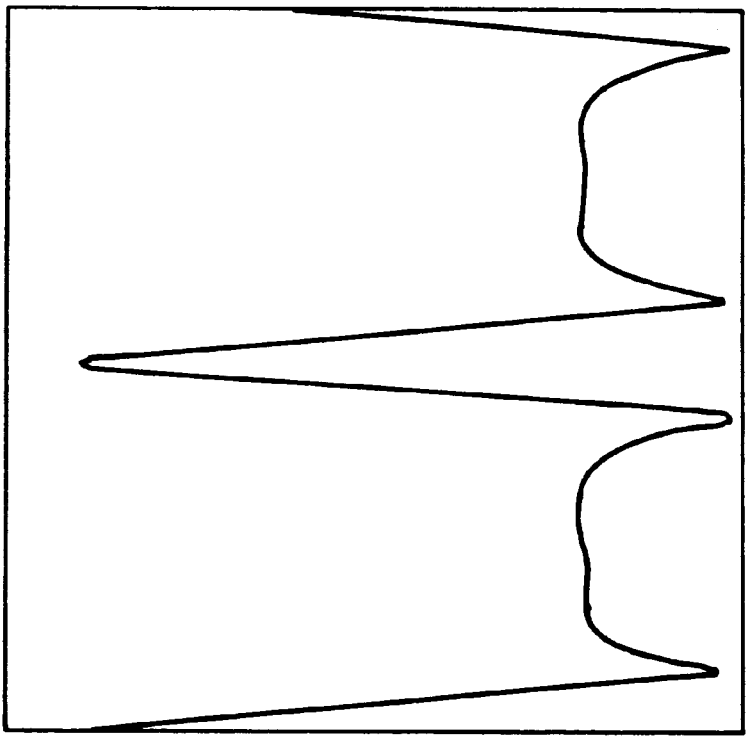

A further feature of the exit wave is that, as for the probe in a normal STEM instrument, the phase of the exit wave is very nearly constant across the amplitude peak. This constant value of the phase increases to π, relative to a constant background value, as the crystal thickness increases to the optimum value giving the sharpest intensity peak. The amplitude and phase of the wave formed at the exit face of an Au[001] crystal, 28 Å thick, for a plane wave incident are shown in FIGS. 9(a) and 9(b), respectively. It is therefore a good approximation to model the transmission function of the atomic focuser as a real function, p(x,y) added to a constant, complex background, H=J+iK, as suggested in FIG. 10, for simulations of the intensity in the STEM detector plane. A similar factorization of the exit wavefunction into the incident probe and some channeling function has been described and discussed by Broeckx et al. (1955), Ultramicroscopy 60, 71–80. For illumination by a STEM instrument having an objective-lens transfer function T(u) (considered in one dimension for convenience), and a spread function t(x)=c(x)+is(x), where c(x) and s(x) are real functions, the wave incident on the specimen is then t(x).{H+p(x)}. For a thin specimen, the transmission function may be taken as q(x)=exp{−iσφ(x)} with Fourier transform Q(u). The intensity distribution on the plane of observation, when the focuser is translated by an amount X relative to the specimen, is given by $$I_X(u)=|Ft.[t(x).\{H+p(x-X)\}.q(x)]|^2=$$
$$|H|^2.|T(u)*Q(u)|^2$$
$$+|T(u)*Q(u)*P(u)\exp\{2\pi iuX\}$$
$$|^2+2Re.[H^*\{T^*(u)*Q(u)\}.\{T(u)*Q(u)*P(u)\exp(2\pi iuX)\}] \quad (1)$$

where Ft. indicates a Fourier transform, P(u) is the Fourier transform of p(x), Re is the real part of the function, and the sign, on line, indicates a convolution integral. The STEM signal produced by the focuser is then given by integrating the intensity over the aperture, D(u), of the detector for each position, X, of the focuser relative to the specimen:

$$J(X)=\int I_X(u).D(u)du. \quad (2)$$

As in normal STEM theory (J. M. Cowley et al., in Scanning Electron Microscopy, 1978),the bright-field image may be approximated by assuming the detector function to be a delta-function, on axis, $D(u)=\delta(u)$. Applying this to the first term of (1) gives just a constant term, equal to the total intensity of the incident beam for a weak-phase object, $q(x)=1-i\sigma\phi x)$. The contribution of the second term of (1) to the BF STEM image is $$\{p(X)*q(X).t(X)\}*\{p(x)*q^*(X).t^*(X)\} \quad (3)$$

and for a weak-phase object this gives an image of the projected potential distribution convoluted by $\{t(X)*p(X)\}$ which, because $p(X)$ is much narrower than $t(X)$, is very close to being just $t(X)$ so that this term is close to being a normal STEM image of $\sigma\phi(X)$.

The ultra-high resolution components of the image appear in the third, cross-product term of (1). For a weak phase object, putting $S=\int s(X)\sigma\phi(X)dX$ and $C=\int c(X)\sigma\phi(X)dX$, this becomes $$2J\{1+S\}.\{p$$
$$(X)*c(X)+p(X)*\sigma\phi$$
$$(X)s(X)\}-C.\{p$$
$$(X)*s(X)+p(X)*\sigma\phi$$
$$(X)c(X)\}]$$
$$-2K[(1+S).\{p$$
$$(X)*s(X)+p(X)*\sigma$$
$$\phi(X)c(X)\}$$
$$+C.\{p(X)*c(X)+$$
$$p(X)*\sigma\phi(X)s(X)\}]. \quad (4)$$

For a phase difference of $\pi$ between the peak $p(X)$ and the background, as in the optimum case of imaging illustrated in FIG. 9(b), K=0, and for the optimum defocus of the illuminating STEM beam, for which $s(X)$ is a large negative peak and $c(X)$ is small, the first-order component of (4) reduces to $$2J.p(X)*\sigma\phi(X).s(X) \quad (5)$$

which represents an image of the illuminated region of the sample with a resolution limited by the width of the $p(X)$ peak. For the "minimum contrast", in-focus setting of the STEM for which it can be assumed that $s(X)=0$, the corresponding contribution to the image is $2J.\{p(X)*c(X)\}$, which is a low-resolution form of a normal STEM image of the $p(X)$ function, independent of the specimen.

For a different thickness of the atomic focuser, it may be that the phase difference of $p(X)$ relative to the background is an odd multiple of $\pi/2$, so that J=0. Then there is an ultra-high resolution component of the image for both the minimum-contrast position and the optimum defocus position, for which the components are, respectively, $$2K.[p(X)*\sigma\phi(X)+C.\{p(X)*c(X)\}]. \text{ and } 2K[(1+S).\{p(X)*s(X)\}+ \{p(X)*\sigma\phi(X)s(X)\}] \quad (6)$$

This suggests that a first-order ultra-high resolution imaging of the projected potential will be given for most values of the phase factor H and for most defocus values of the illuminating STEM probe. The contrast of the ultra-high resolution images for particular cases may be determined from computer simulations. The reciprocity relationship, however, suggests that the contrast observed is the same as for the TEM single-focuser case which has been simulated and has shown useful contrast for single-atom specimens.

The assumption of a very small detector, approximated by a delta-function. implies that the signal strength for the BF STEM imaging is very small. In practice, for normal STEM, it is convenient to use a detector aperture which accepts an appreciable fraction of the incident beam spot of the diffraction pattern so that the image signal strength is convenient. As has been shown earlier (J. M. Cowley et al., in Scanning Electron Microscopy, 1978), the effect of increasing the detector aperture diameter is to decrease the contrast of the BF image, slowly at first and then rapidly, to give zero contrast for weak-phase objects when the detector accepts all the central beam. The resolution improves slightly with increasing detector size. A suitable compromise is then usually found to give the most desirable balance of image intensity, resolution and contrast for any particular application. It is anticipated that the same considerations will apply for the ultra-high resolution STEM imaging with atomic focusers.

For dark-field imaging, the situation is different from that of normal STEM in which the central beam spot of the diffraction pattern is an image of the STEM objective aperture. For an atomic focuser, illuminated by a STEM beam, there is a similar central spot given by the background term, H, but the more important component part of the "central spot", related to the ultra-high resolution imaging, is given by $|P(u)|^2$, which is a continuous, broad distribution of half-width about 2 or 3 $\text{Å}^{-1}$. The convolution with $Q(u)$ in (1) then gives a similar, but somewhat broader distribution. For a weakly scattering object, the use of any annular detector will therefore give a large background plus a small positive or negative signal due to the object, depending on the relative phase and on whether the detector includes the inner part or outer part of the intensity distribution.

A more effective form of detector may be a split detector, omitting the central part of the diffraction pattern which is the image of the objective aperture due to H, and divided along a line perpendicular to the direction of the beam scan giving a signal produced by subtraction of the signal from one half-detector from the signal from the other half, as in the case of the "differential contrast" detectors developed, for example, by Chapman et al., Ultramicroscopy 47 (1992), 331.

Thus, for a weak phase object, assuming that $P(u)$ is real and that $Q(u)$ is symmetrical, as for a single atom, the intensity distribution in the plane of observation due to the focuser peak is $$I(u)=P^2(u)+|P(u).\exp\{2\pi iuX\}*Q(u)|^2+2\sigma P(u).[P(u)*(\phi(u)\sin 2\pi iuX)\} \quad (7)$$

In this, the first two terms are even in u and the third is odd. Hence with a split detector, and with the signals for positive and negative u being subtracted, the first two terms give no contribution to the signal as a function of X and the last term gives a signal proportional to the first power of F(u) which is antisymmetric about the atom position and has a width depending on that of $p(X)$ in both the beam-scan direction and at right angles. The main limitation to such a first-order imaging system may well be the noise from the subtraction of the two large background signals.

(b) Support and Illumination of the Focuser Atom

The atom used as a focuser should necessarily be held on a suitable support which should not distort its electrostatic field. This is best achieved for a very heavy atom such as U or Au on a very thin light-atom support, such as an amorphous carbon film about 1 nm thick. However experience has shown that for such supports, heavy atoms tend to be mobile as described in "Direct observations of atomic diffusion by scanning transmission electron microscopy," 74 Proc. Acad. Sci. USA 1802–6 (1977). incorporated herein by reference. Accordingly, the heavy atom should be held tightly, as in a crystal of the element or by chemical bonding on or in a light-atom crystal or semi-crystalline solid, such as an oxide or carbide.

In most STEM systems, there is a tendency for the incident beam to drift, or to be deflected relative to the specimen by mechanical vibrations or electrical instabilities. This may be overcome by a feed-back system designed to produce signals on the standard beam-deflector coils to keep the incident beam centered on the focuser atom. The signal for the feed-back control system may come, for example, from the directly transmitted beam if the specimen is not a strong scatterer and is imaged in the dark-field mode. A four-quadrant, split detector, such as is used in the differential phase-contrast STEM schemes for imaging magnetic or electrical fields, as described in "Electron Microscopy of Magnetic Materials" 22 EMSA Bulletin 64–75 (1992) incorporated herein by reference, could reveal any deviation from a centro-symmetric intensity distribution, such as would be produced when the incident beam is not centered on the focuser atom, and so could produce a deflection of the incident beam to recenter it. Such a feed-back system could also be used to keep the incident beam focused on the focuser atom for the case that the focuser-atom, rather than the specimen, is mounted on the piezo deflection system to produce the relative motion of this atom and the specimen.

(c) The Piezo-electric Scanning System

It has been amply demonstrated that a piezo manipulation and scanning device may be mounted and operated within the limited space available within the pole-piece area of an electron microscope. This was first demonstrated within this laboratory, as described in "Observations of the Graphite Surface by Refection Electron Microscopy during STEM Operation" 33 Ultramicroscopy 69–82 (1990) incorporated herein by reference. The stability and effectiveness of the scheme was demonstrated by the resolution of atoms in STEM images of graphite surfaces.

For an arrangement involving atomic-focuser imaging, piezoelectric deflection elements should take the form of hollow cylinders in order to allow the transmission of the incident or scattered electron beams. This requirement is not incompatible with standard piezo system designs.

(d) Differential Scanning Systems

In an alternate embodiment, the single heavy atom could be replaced by a very thin crystal, so aligned that the incident electron beam is parallel to prominent rows of atoms through the crystal. By suitably deflecting the incident electron beam it could be arranged that each row of atoms of the crystal could, in turn, be used to form a fine electron probe on the specimen. In this case, a considerable area of the specimen may be imaged with a relative movement of the specimen and crystal, produced by the piezo deflection system, which is very small, not exceeding the dimensions of the crystal unit cell periodicity.

(e) Performance of the System

The theoretical analysis of the focusing action of single heavy atoms and lines of atoms shows that the resolution that should be achieved could be better than 0.05 nm. The limitations of image resolution by the so-called incoherent limiting factors such as chromatic aberration are not applicable for a STEM scheme and limitations of resolution by mechanical and electrical instabilities should be largely overcome by the feedback system described above. The main limitations may arise from the difficulty of controlling the relative motions of the specimen and the focuser atom(s).

The depth of field of the imaging system would be small, of the order of 0.5 nm. for 100 keV electrons. This would be the case for any imaging system of equivalent resolution because a resolution of 0.05 nm implies an electron beam convergence of the order of $10^{-1}$ radians. For particular cases, this small depth of field could be an advantage in that it provides an approximation to the imaging of an extended specimen in three dimensions.

2. A Single-atom Focuser in a TEM System (Scheme 2)

Figure 2:
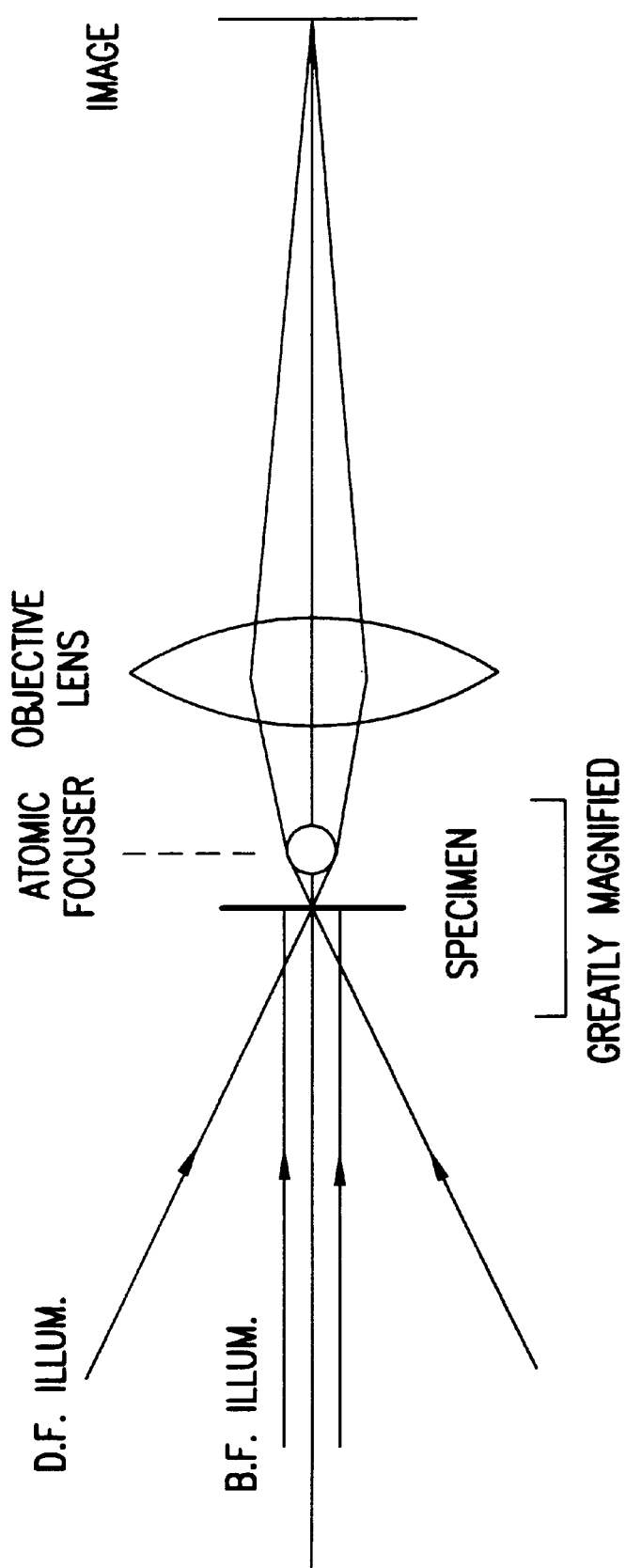
FIG. 2 is a diagrammatic illustration of the use of an atomic focuser for TEM (transmission electron microscopy) in accordance with Scheme 2.

A single-atom focuser may be incorporated in a standard TEM instrument as suggested by FIG. 2. The focusing atom serves as an initial, very short focal-length objective lens. The Reciprocity Relationship, as described in "Image contrast in a Transmission Scanning Electron Microscope" 15 Appl. Phys. Lett. 58–59 (1969) incorporated herein by reference, ensures that the same image resolution and contrast will be achieved as with the STEM system. Differences between the STEM and TEM cases arise from some experimental considerations.

For TEM, chromatic aberration effects are relevant because the imaging lenses follow the specimen where energy losses occur. However for the atomic focuser case, the chromatic aberration coefficients are so small that the chromatic aberration limitations on resolution, due to energy losses in the specimen or energy spread of the incident beam, should be negligible.

For normal TEM, no scanning of the specimen is necessary. However, with the atomic focuser, the field of view for the two-dimensional image formed by the atomic focuser would be limited to much less than 1 nm. Hence, in a preferred embodiment, in order allow a useful area of the specimen to be viewed, some scanning device, such as a STM-type piezo system, would be needed.

For TEM, the equivalent of high-angle dark-field imaging in STEM is provided by hollow-cone illumination of the specimen, which may present some difficulties. The feedback system suggested as a means for maintaining the position of the incident beam for the STEM case would be difficult to apply in the TEM case but should not be necessary. Otherwise, the considerations for the STEM case apply also to the TEM case.

3. A Crystal Multiple Focuser for a TEM Instrument (Scheme 3)

(a) General Considerations

Figure 3:
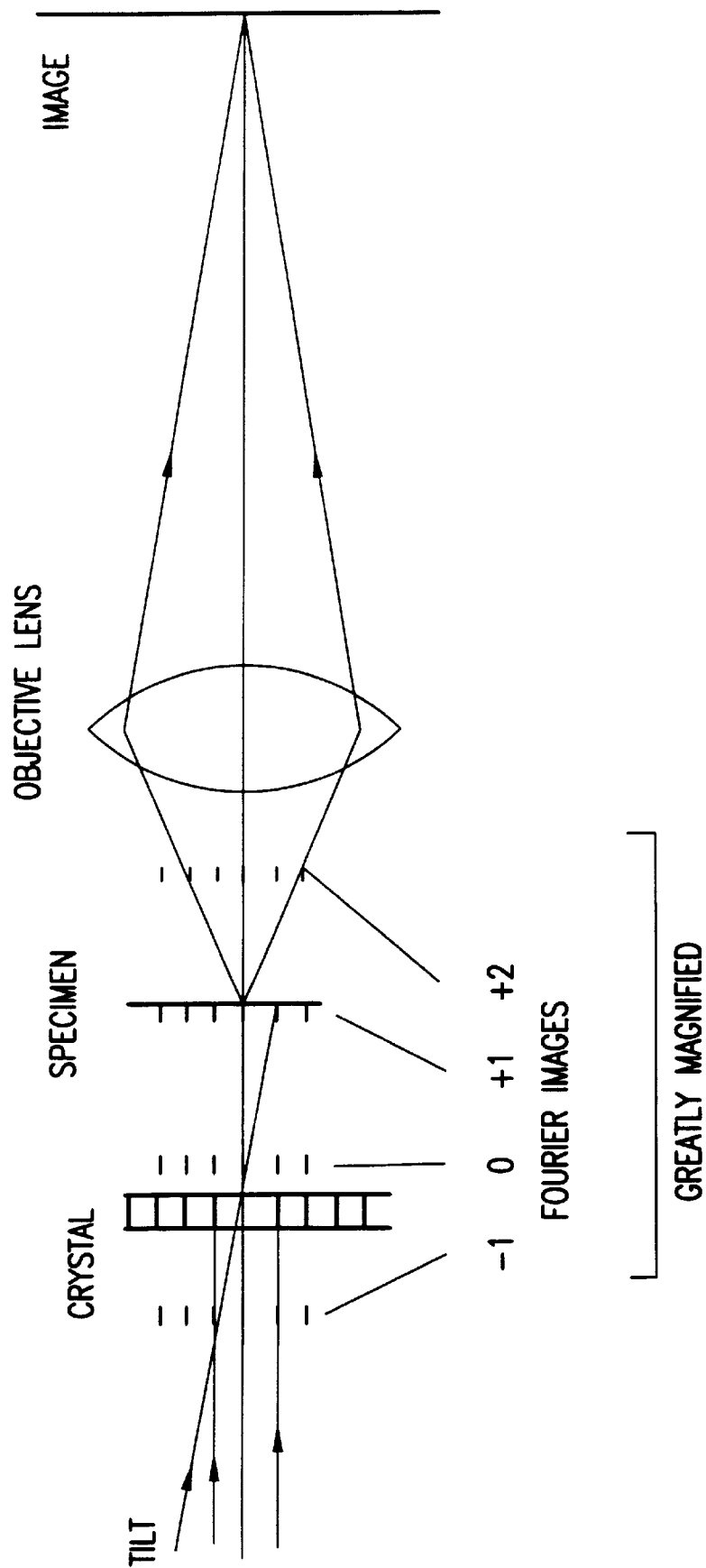
FIG. 3 is a diagrammatic illustration of the use of a crystal multiple focuser for TEM (transmission electron microscopy) in accordance with Scheme 3.
Figure 4A:
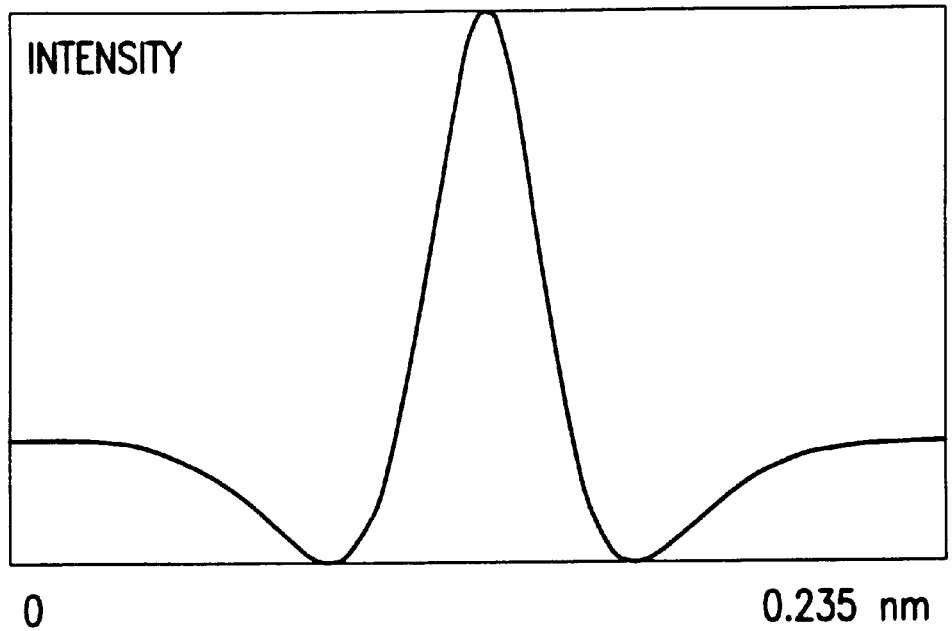
FIGS. 4(a)–4(d) are graphical illustrations for Scheme 3, of electron intensity versus distance for various beam tilts for calculated intensities of the second Fourier image plane profiles of an electron beam formed by a gold crystal 25.4 nm thick.
Figure 4B:
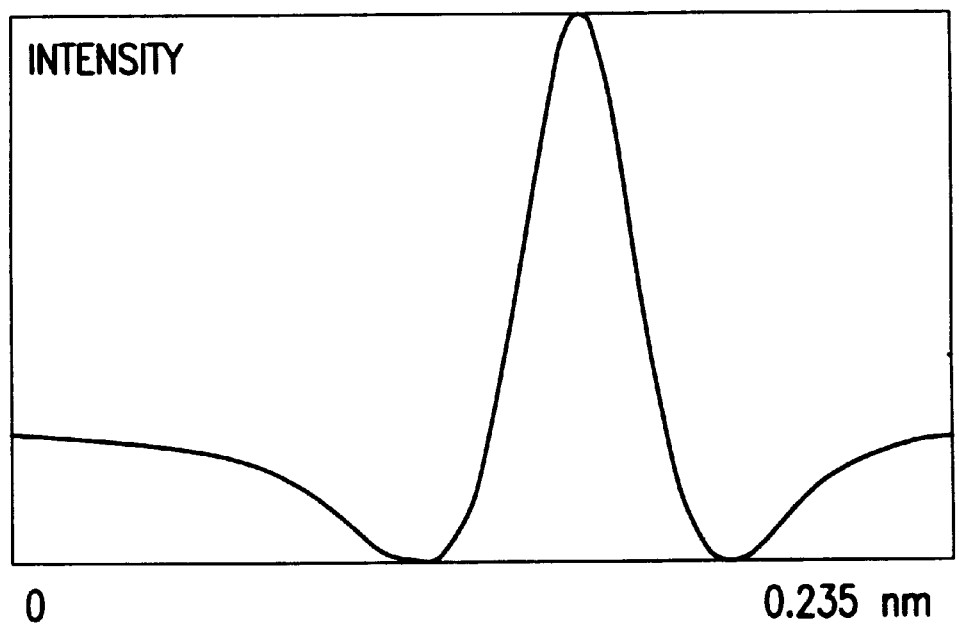
Figure 4C:
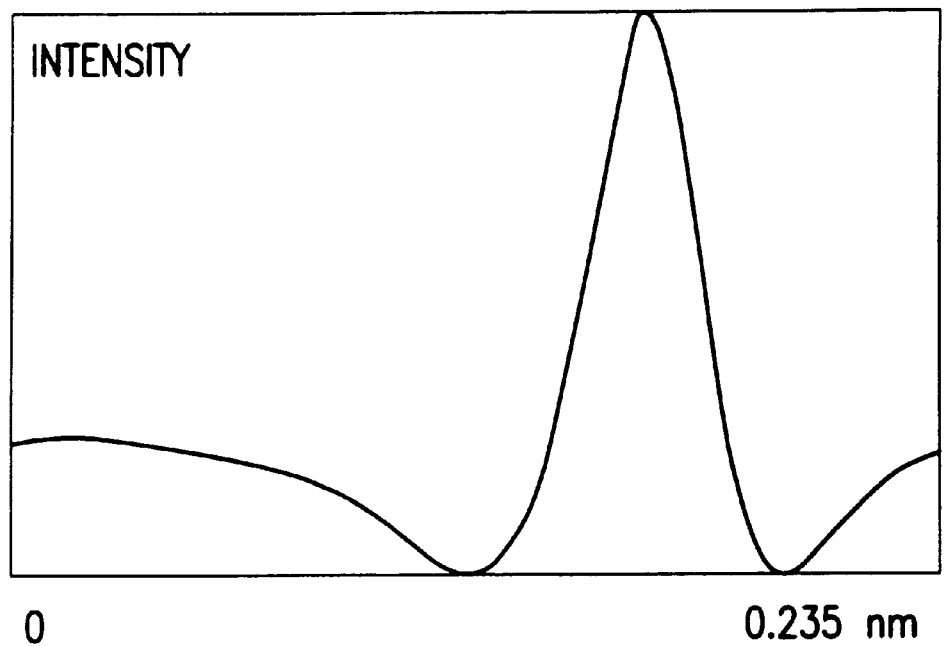
Figure 4D:
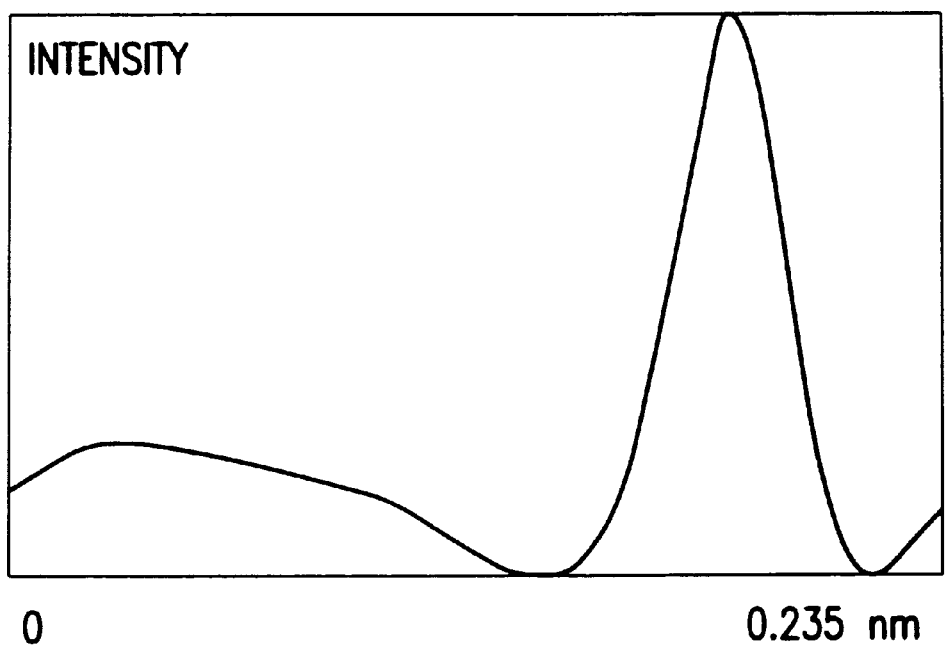

In the diagram shown in FIG. 3, a thin crystal, mounted in a principal orientation, is illuminated by a coherent plane wave such as is produced, to a good approximation, by an illuminating system incorporating a field-emission gun. At a distance of a few nanometers from the exit face of the crystal a two-dimensional set of fine cross-overs is formed with the periodicity of the projection of the crystal structure. Because this set of cross-overs, i.e., the "grid," is periodic and coherent, the Fourier image phenomenon occurs, so that exact reproductions of the wave-function of the grid occur at regular intervals in the beam direction, as described by John M. Cowley in *Diffraction Physics,* 3d edition, chapter 1, page 20 (1995) incorporated herein by reference. For a one-dimensional periodicity of the grid of a, the distance between Fourier image planes is $a^2/\lambda$ where $\lambda$ is the electron wavelength. For example, for a gold crystal in [100] orientation, a=0.203 nm and for 100 keV electrons with 1=3.7 pm, the distance between Fourier image planes is about 11 nm. Thus the illumination of the specimen is the same if the specimen is placed at any multiple of 11 nm after or before (virtual Fourier images) the grid of cross-overs at the exit face of the crystal.

If a TEM instrument having a resolution limit equal to, or less than, the periodicity of the crystal multiple-focuser (i.e., 0.2 nm or less in the case of the Au [001] crystal), forms an image of the specimen illuminated by the grid, then each pixel of the electron microscope image has an intensity given by the transmission through the specimen of one element of the grid of fine cross-overs which has a diameter of the order of 0.05 nm. A series of such images may be obtained with relative displacements of the grid and the specimen, such that each of the grid points samples in turn a set of equally-spaced points within an area of the specimen equal to the area of the projected crystal unit cell. Such a series of images would then contain all the information required to produce an image of the specimen with a pixel size equal to the diameter of the grid points, namely about 0.05 nm or less. Thus an image of greatly enhanced resolution can be achieved.

In order to obtain such a series of images, it is believed necessary to produce relative translations of the grid and the specimen by steps of the order of 0.05 nm over distances of the order of plus or minus 0.1 nm. Such relative translations may be produced by a piezoelectric system such as is used in STM instruments. However, when the specimen is illuminated by a Fourier image of the original grid of fine cross-overs, the relative translations may be achieved much more simply and conveniently by tilting the incident electron beam. For the case of the gold [001] crystal described above, for example, if the specimen is illuminated by the first Fourier image, which is at a distance of about 12 nm from the crystal exit face, a translation of the grid relative to the specimen by 0.1 nm is achieved with a tilt of the incident electron beam of less than $10^{-2}$ radians. Smaller tilts are required for higher-order Fourier images which are further from the crystal.

The feasibility of the system for translating the grid by tilting the incident electron beam, even when a crystal of considerable thickness is used, has been verified using computer simulations of the one-dimensional case of the (hhh) reflections for a gold crystal, periodicity 0.235 nm, for 400 keV electrons. As shown in FIGS. 4(a)–4(d), the intensity distribution in a Fourier image 67.5 nm from the crystal is identical with that near the exit face of the crystal and contains a sharp peak, i.e., a grid point, of width at half height of 0.033 nm. The form of the intensity distribution in this sharp peak is unchanged for displacements of the grid points, proportional to the incident beam tilt, of 0.1 nm or more. The displacements are increased in proportion to the distance from the crystal, for higher-order Fourier images.

(b) Factors Affecting the Achievable Resolution

The image of greatly improved resolution is derived by coordination of the data from a series of images obtained with different tilts of the incident beam. The individual images may be recorded digitally by use of a CCD camera system. The total recording time and the sensitivity to specimen drift would, as a first approximation, be the same as if the final image were obtained with a hypothetical conventional-type microscope having an equivalent resolution, although, in the case of the series of images, some manipulation of the data to reduce both of these factors may be possible. The contrast of the image derived from the series would be less than for straight-forward imaging with equivalent resolution because, as seen in FIGS. 4(a)–4(d), there is a non-zero background to the peaks of the grid function. The background signal may be reduced, however, by subtracting a constant background if the signal-to-noise ratio is sufficiently large.

The "incoherent" resolution-limiting factors of chromatic aberration and beam convergence have no effect on the finally-derived ultra-high resolution image provided that the resolution of the microscope used, including the effects of these factors, is sufficient to resolve the periodicity of the multiple-focuser crystal.

The resolution of the ultimate image may be degraded by any relative movement of the crystal and the specimen resulting from mechanical instabilities. If the tilting of the incident beam is used, rather than the STM-type piezo system, to produce relative displacements, the mechanical instabilities may be reduced by attaching the specimen firmly to the multi-focuser crystal, using some spacer to establish a suitable gap between them. If necessary, the condition that the specimen should lie on a Fourier image plane may be established by adjustment of the Fourier-image distance by varying the accelerating voltage, and hence the wavelength, of the incident electrons.

As a means for avoiding the difficulties associated with translating a specimen held at a distance of about 20 Å from an atomic focuser, if a thin crystal multiple focuser is used, the specimen may be placed at the position of one of the Fourier images formed by the periodic exit wave from the crystal. Then the distance of the specimen from the crystal focuser may be of the order of 1000 Å, and the periodic array of fine probes can be translated across the specimen by tilting the plane-wave beam incident on the crystal. The necessary mechanical stability of the specimen relative to the crystal focuser may then be assured by attaching the specimen firmly to the crystal. The ultra-high-resolution image data is then collected by using a normal high-resolution TEM to record a set of images with different tilts of the incident beam.

As illustrated by FIGS. 11(a)–11(c), the specimen is illuminated by the array of very fine cross-overs. For each cross-over, the TEM gives an image of normal TEM resolution on the image plane. For each peak, a corresponding intensity value is assigned to the peak-center position. The sets of values found for all incident-beam tilts are correlated to form the ultra-high resolution image of FIG. 11(c).

Figure 10A:
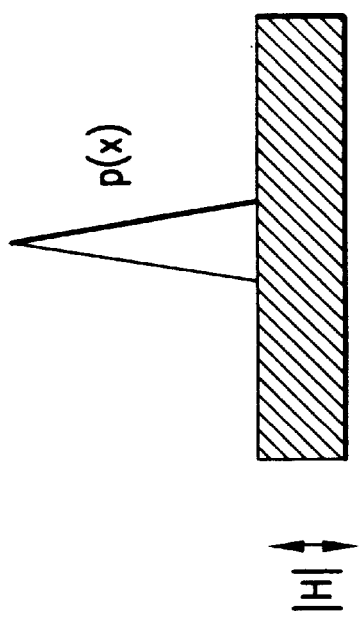
FIGS. 10(a) and 10(b) are schematics of models for the transmission function of a single-atom focuser and a crystal multiple focuser, respectively, used as a basis for analytical treatments of the imaging properties.
Figure 10B:
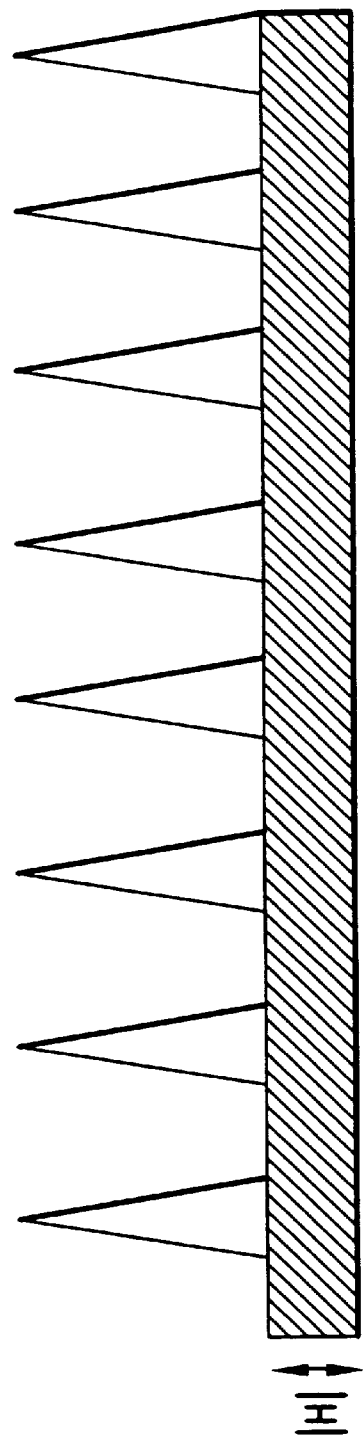

Analytical expressions for the intensities of the TEM images formed with this system may be made using reasonable approximations for the wave produced by the crystal focuser, as in FIG. 10. Since, as in FIG. 9, it has been shown that the phase is constant across the sharp central peak of intensity formed at the atomic positions for a crystal of optimum thickness, the exit wave from the crystal can be modeled as $$\psi_c(x) = \exp\{2\pi i u_0 x\} \cdot [H + \Sigma_n p(x) * \delta(x - na)] \tag{8}$$

where $u_0$ indicates the incident beam tilt, p(x) is the real amplitude peak function, a is the crystal periodicity and H is a constant background, assumed to be complex, H=J+iK, in order to allow for the phase difference of the peak relative to the background. For a distance R between the crystal and the specimen which has a transmission function q(x), the wave-function in the image plane of the TEM instrument, which has a transfer function T(u) and a spread-function t(x), is then given by $$\psi(x) = q(x)[\exp\{2\pi i u_0 x\}\{H + \Sigma_n p(x - na)\} * \exp\{-\pi i x^2 / R\lambda\}] * t(x) \tag{9}$$

If R is a Fourier image distance, substituting $R=2na^2/l$, in this expression gives, with a little manipulation, the TEM image intensity as $$I(x)=|H.q(x).\exp\{2\pi iu_0x\}*t(x)\}+\{\Sigma_n p(x+R\lambda u_0-na).q(x).\exp\{2\pi iu_0x\}\}*t(x)\}|^2 \quad (10)$$

The square of the first term in this expression for $u_0$ small, is just the normal bright-field image of the specimen, giving the intensity distribution $|H|^2.|q(x)*t(x)|^2$. If the specimen is a weak-phase object, $q(x)=1-i\sigma\phi(x)$ and $t(x)$ is written as $t(x)=c(x)+is(x)$, where c and s are real, this takes the familiar form $$I_1(x)=|H|^2.[1+2\sigma\phi(x)*s(x)] \quad (11)$$

The square of the last term of (10), for a weak-phase object, becomes $$I_2(x)=(\Sigma_n p(x+R\lambda u_0-na)*c(x))^2+(\Sigma_n p(x+R\lambda u_0-na)*s(x))^2-\{\Sigma_n p(x+R\lambda u_0-na)*c(x)\}.\{\sigma\phi(x)\Sigma_n p(x+R\lambda u_0-na)*s(x)\}+\{\Sigma_n p(x+R\lambda u_0-na)*s(x)\}.\{\sigma\phi(x).\Sigma_n p(x+R\lambda u_0-na)*c(x)\} \quad (12)$$

In this expression, the first two terms give a normal TEM image of the crystal focuser, as if no specimen were present. The last two terms give first-order images of the projected potential of the specimen, sampled by the set of ultra-fine probes. It may be noted that the expression containing s(x) is multiplied by one containing c(x) and vice versa. Since s(x) is very small when c(x) is a maximum and c(x) is small when s(x) is a maximum (optimum defocus), and these two terms are of opposite sign, the total contribution of these terms may be small.

Writing, for brevity, $f(x)=S_n p(x+Rlu_0-na)$, the cross-product term of (10) becomes, for small $u_0$, $$I_3(x)=2Re.[(J-iK).\{q^*(x)*t^*(x)\}.\{(f(x).q(x))*t(x)\}]. \quad (13)$$

and for the weak-phase-object approximation, this gives, $$+2[\{f(x)*c(x)\}.\{J.(1-\sigma\phi(x)*s(x))-K.(\sigma\phi(x)*c(x))\}$$
$$+\{f(x)*s(x)\}.\{J.(\sigma\phi(x)*c(x))+K.(1-\sigma\phi(x)*s(x))\}$$
$$+\{\sigma\phi(x)f(x)*s(x)\}.\{J.(1-\sigma\phi(x)*s(x))-K.(\sigma\phi(x)*c(x))\}$$
$$-\{\sigma\phi(x)f(x)*c(x)\}.\{J.(\sigma\phi(x))+(1-\sigma\phi(x)*s(x))\}] \quad (14)$$

In this expression, the desired terms, giving rise to the ultra-high resolution image, are those in $\sigma\phi(x).f(x)$, involving the sampling of the projected potential by the periodic array of very fine probes. These terms are weighted according to the phase of the fine probes and the focus of the microscope that views them. It has been seen that, as in FIG. 9, the phase of the probes, relative to the background may be $\pi$ for an optimum crystal thickness, in which case $J=-1$ and $K=0$, so that this term (14), becomes:

$$-2\{f(x)*c(x)\}.\{1-\sigma\phi(x)*s(x)\}$$
$$-2\{f(x)*s(x)\}.\{\sigma\phi(x).*c(x)\}.$$
$$-2\{\sigma\phi(x).f(x)*s(x)\}.\{1-\sigma\phi(x)*s(x)\}$$
$$+2\{\sigma\phi(x).f(x)*c(x)\}.\{\sigma\phi(x)*c(x)\}. \quad (15)$$

For the Scherzer optimum defocus of the microscope, s(x) is a large negative peak but c(x) is small and broad and, to a first approximation, can be neglected. This term then becomes $$-2(\sigma\phi(x).f(x))*s(x). \quad (16)$$

so that there are resolved peaks in the microscope image of intensity depending on the sampling of the projected potential by the set of ultra-fine probes. Putting $f(x)=f(x+\eta)$, where $\eta=R\lambda u_0$, and integrating each of the peaks, s(x), of the TEM image to give $s_0$, the variation of the signal as a function of the angle of incidence is seen to give $-2s_0.\sigma\phi(\eta).p(\eta)$.

For the defocus ("in-focus") corresponding to minimum contrast in normal TEM WPOA images, it is a good approximation to put s(x)=0, and the only terms remaining in (15) are of second order in sj and are therefore negligibly small.

For a different crystal thickness, the phase difference of the probes relative to the background may be an odd multiple of $\pi/2$, in which case J=0 and K=1 (or −1). With these values inserted in (14), it is seen that for the "optimum defocus" the intensity term is $$-2\{f(x)*s(x)\}.\{1-\sigma\phi(x)*s(x)\} \quad (17).$$

and this represents a low contrast normal TEM image of the specimen, modulated by a TEM image of the set of probes. The "in focus" image, however, contains, in addition, the term $$-2\sigma(\phi(x).f(x))*c(x), \quad (18)$$

which is almost as favorable as (16) if the TEM used is able to resolve the periodicity of f(x) in the in-focus condition. Again, the variation of the integrated value for each TEM peak with the angle of incidence gives a signal proportional to j(h).p(h).

Thus the terms (16) or (18) allow a sampling of the object transmission function with the super-high resolution at sets of periodically-spaced positions, and the translation of these sets of positions by tilting the incident beam allows the complete ultra-high resolution image of the object to be derived; see FIGS. 11(a)–11(c). These terms are superimposed on constant background terms and terms representing the images with normal TEM resolution of the specimen. The relative magnitudes of the background, the ultra-high resolution parts and the normal TEM resolution parts of the image are best found by computer simulations for representative cases.

Figure 12A:
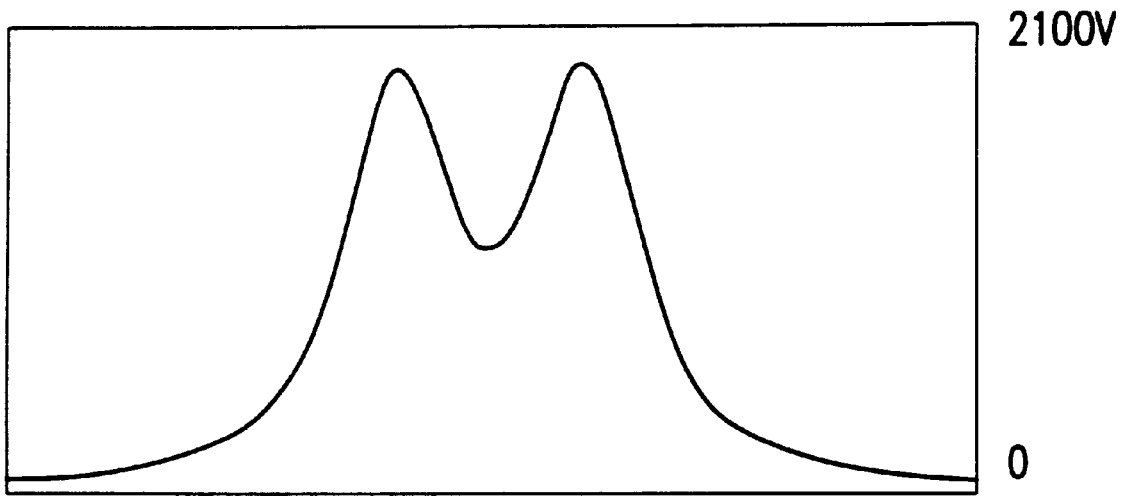
FIGS. 12(a) and 12(b) are simulated images for the crystal focuser TEM scheme (Scheme 3).
Figure 12B:
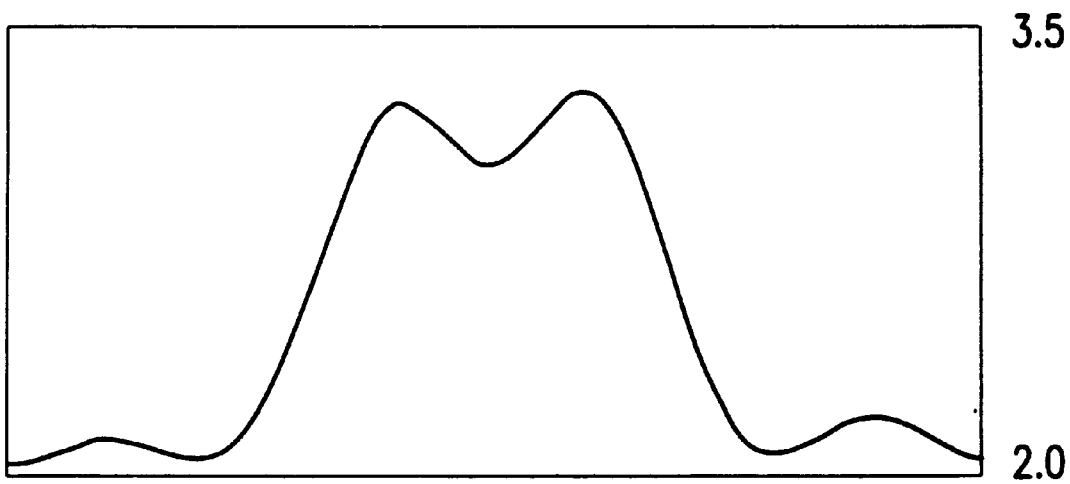

This imaging process has been simulated for an idealized case. The amplitude distribution in a set of very fine probes formed at a Fourier image distance of 332 Å from an Au[001] crystal is simulated for various angles of incidence of a plane wave. This set of fine probes passes through the specimen, consisting of two gold atoms separated by 0.5 Å in the y-direction, repeated with the periodicity of 4.07 Å of the Au unit cell. The heights of the corresponding peaks in the image of the sampled specimen, formed with a TEM having Cs=1 mm, with 200 kV electrons, an underfocus of 410 Å (which appeared to give the best images) and an objective aperture semi-angle of 40 mrad, are then found as a function of the angle of tilt of the incident beam. The plot in FIG. 12(b), representing the reconstruction from a series of TEM images, suggests that the two Au atoms, 0.5 Å apart, should be clearly resolved. Total image width is 2.54 Å.

(c) Mounting the Specimen

In order to avoid any relative motion of the specimen and the multiple-focuser crystal, it is desirable to firmly attach one to the other with a suitable spacing between them. This may be achieved, for example, in the following way. A thin, self-supporting single-crystal film is prepared, mounted on a standard electron microscopy metal grid. On one side of the crystal film, a thin film of some material having a high density of holes of diameter 10 to 1000 nm is attached. This could be, for example, a "holey carbon film", such as is commonly used for specimen mounting, or a film with a regular array of holes produced by electron-beam or ion-beam machining. Then the specimen is placed on top of the holey film, supported, if necessary, by a very thin layer of amorphous carbon or other suitable support film. The useful specimen area is then confined to the holes in the holey film.

It may be possible to replace the combination of a holey film plus a thin carbon film by a continuous film of constant, known thickness if this film is of light-atom material and if the specimen is of heavier-atom material, although, in this case, the contrast and resolution of the final image may be affected by the random phase noise from the continuous film.

4. A Crystal Multiple-focuser in a STEM Instrument (Scheme 4)

Figure 5:
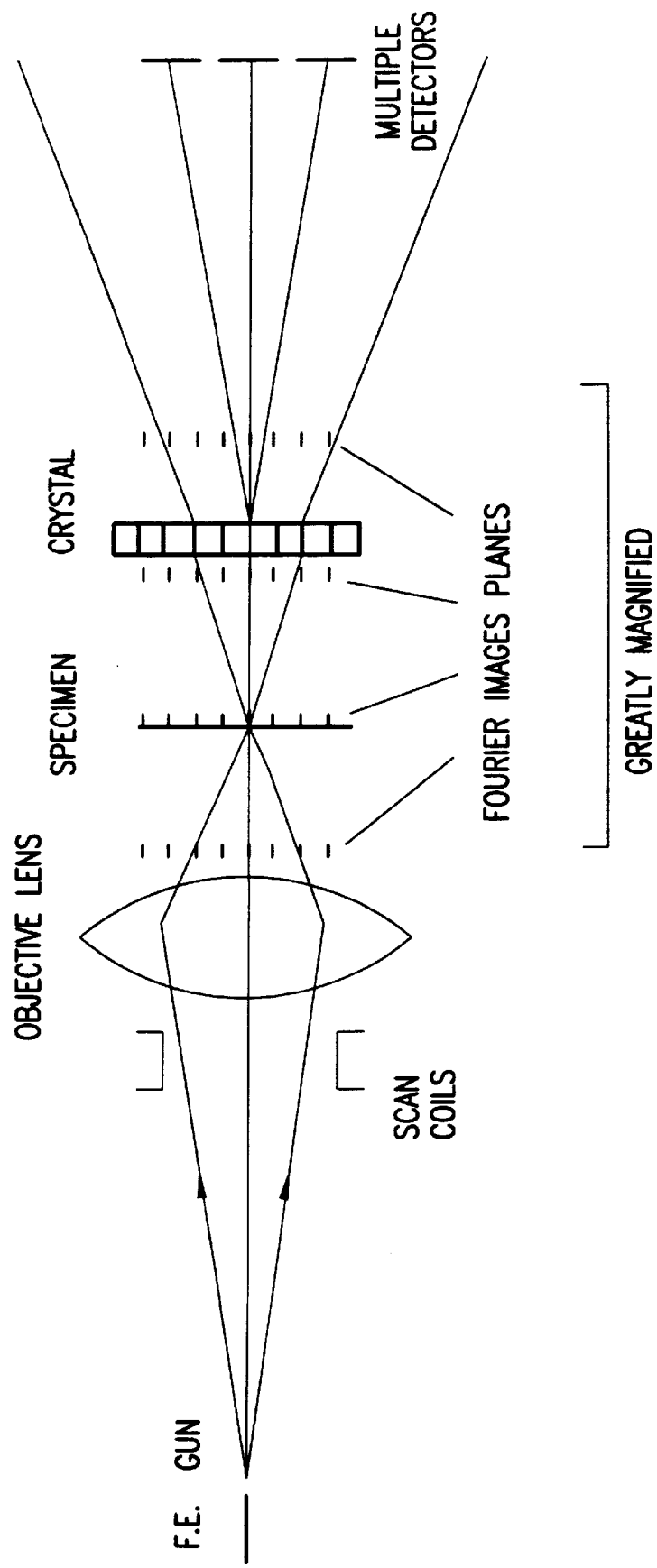
FIG. 5 is a diagrammatic illustration of a crystal multiple focuser for a STEM in accordance with Scheme 4.

This arrangement for a crystal multiple-focuser in a STEM is similar to the arrangement for a TEM instrument by the Reciprocity Relationship, as is evident from the comparison of the diagram, FIG. 3 and FIG. 5. Hence the attainable resolution and contrast are the same as for the TEM case, and the schemes differ only in terms of experimental factors.

A STEM instrument having sufficient resolution to resolve the periodicity of the multiple-focuser crystal, is used to form a cross-over at the specimen. The specimen is placed at a Fourier image distance from the plane outside the specimen where, for the TEM case, the grid of very fine cross-overs is formed. Then an axial detector, effectively at infinity, records the image signal as the incident electron beam is scanned over the specimen. Note that, for this configuration, a point cross-over at the specimen forms a Fourier image of the grid, with very large magnification, at the detector plane.

To record the same set of images as for the TEM case, with relative translations of the arid and the specimen, one can move the detector so that it records radiation propagating in different directions. Alternatively, if an array of properly-spaced detectors is used, all the required images could be acquired simultaneously, rather then sequentially, so that, with on-line manipulation of the signals, the final super-high resolution image of the specimen could be produced with just one scan of the incident beam over the specimen. For the Au [001] case discussed above, for example, the use of 16 detectors in a 4×4 array, would allow a reduction of the resolution limit from 0.2 nm to 0.05 nm.

The factors governing the final image quality for this STEM case parallel those for TEM with respect to such things as the incoherent imaging factors and image resolution and contrast. The scanning of the incident beam over the specimen is slower than for the normal 0.2 nm resolution STEM so that the number of pixels necessary for the super-high resolution image can be produced. The term ultra-high resolution is used synonymously with super-high resolution.

The methods for specimen preparation and manipulation are the same as for the TEM case.

5. Fourier Images at Infinity for STEM and a Crystal Multiple Focuser (Scheme 4)

A further scheme for using a crystal multiple atomic-focuser to obtain ultra-high resolution imaging may be considered as related to that described in Section 3 above, by the reciprocity relationship. A focused beam from a standard STEM instrument, having a resolution for normal STEM imaging of the order of 2 Å, illuminates a specimen which is held at a Fourier image distance from a thin-crystal multiple-focuser. A Fourier image of the focuser crystal is formed at infinity beyond the crystal and an image of the specimen is formed in this Fourier image plane with a resolution given by the probe-size formed by an atomic-focuser element; see FIG. 3 and FIG. 5. As shown, the variation of intensity with the direction of the detector element in this case is related by reciprocity to the variation of image intensity with angle of incidence of the beam in the previous scheme.

Figure 13A:
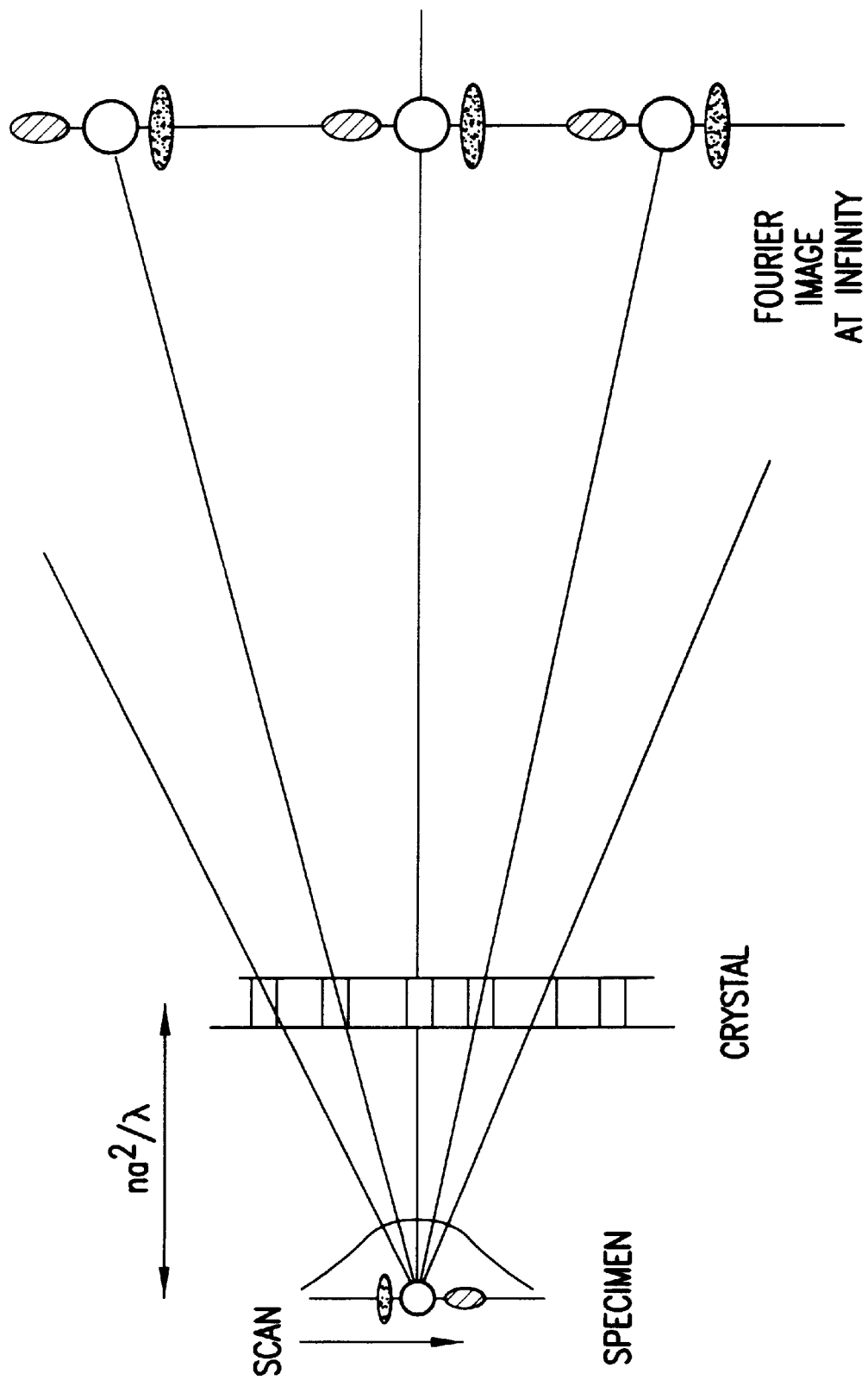
FIG. 13(a) is a simplified diagram for the STEM crystal focuser scheme (Scheme 4).

The essential components of this scheme are represented in FIG. 13(a). The beam from the STEM instrument gives an incident wave-function, t(x), the Fourier transform of the objective lens transfer function, T(u), so that the wave leaving the specimen is $y_0(x)=t(x).q(x)$. This wave is propagated over a distance R to the crystal focuser which has a transmission function, modelled, as in FIG. 10 by a constant background term, H=J+iK, plus an array of sharp peaks, $f(x)=S_n p(x-na)$. The wave leaving the crystal focuser is $$\psi(x)=[\psi_0(x)*\exp\{-\pi i x^2/R\lambda\}].\{H+f(x)\}. \quad (19)$$

The intensity distribution at infinity is then given by the square of the Fourier transform of (19) as $$|\Psi|^2=|H.\Psi_0|^2+|\Psi_0(u).\exp\{\pi i R\lambda u^2\}*F(u)|^2+2Re.[H^*\Psi_0^*\exp\{-\pi i R\lambda u^2\}\{\Psi_0(u).\exp\{\pi i R\lambda u^2\}*F(u)\}]. \quad (20)$$

The first term of this expression represents the convergent beam diffraction pattern of the object in the absence of a focuser crystal. For the case that the object is at a Fourier image distance from the crystal, so that $R=2na^2/\lambda$, the second term reduces to $$|\Psi_0(u)*F(u)|^2=|Ft.\{t(x).q(x).f(x)\}|^2 \quad (21)$$

where Ft. indicates a Fourier transform. This term represents a broad background consisting of a convergent beam diffraction pattern of the focuser crystal plus, for a weak-phase object, a small component depending on sj(x) which is smeared out because the detailed structure of the specimen, is supposed to be on a smaller scale than t(x) or the periodicity off(x).

The third, cross-product, term of (20) reduces, with y=Rlu, to $$2Re.[\{H^*T^*(y/R\lambda)*Q^*(y/R\lambda)\}.\{q(y).t(y)*f(y)\}] \quad (22).$$

For a sufficiently small range of y, it may be assumed that $T^*(y/Rl)$ is unity. For example, for the Fourier image distance for Au[001] of 332 Å and 200 keV electrons, Rl=8 Å$^2$, and if it is asumed that T(u) is unity out to u=0.3 Å$^{-1}$. T$^*$(y/Rl) is unity out to a radius of y=2.7 Å. For a weak-phase object, the convolution with sF(u) gives sj(0), and (22) reduces to $$2f(y)^*[J.\{(c(y)+\sigma\phi(y)s(y)-\sigma\phi(0).(s(y)-\sigma\phi(y).c(y))\}+K.\{s(y)-\sigma\phi(y)c(y)+\sigma\phi(0).(c(y)s(y))\}] \quad (23)$$

Then, for the phase difference x of the peaks of f(x) relative to the background, and for the optimum focus position for which we may neglect c(y). this term gives $$-2\sigma f(y)^*s(y)[\phi(0)+\phi(y)] \quad (24)$$

which gives an image of the projected potential with white spots for atoms and a resolution governed by the width of the peaks of f(y). For the minimum-contrast defocus, putting s(y)=0, there is no contrast due to the projected potential.

For the phase difference of the peaks of f(y) relative to the background equal to an odd multiple of π/2, i.e., J=0, there is no imaging of the projected potential for the "optimum defocus" position, but for the "minimum-contrast" defocus, the contrast is given by $$-2\sigma f(y)^*c(y)\{\phi(0)+\phi(y)\} \quad (25)$$

which, again, gives an ultra-high resolution image of the object.

A simulation of a particular case for this imaging mode has been made for a sample consisting of two gold atoms, separated by a distance of 0.68 Å and illuminated by a STEM instrument with Cs=1 mm for 200 keV electrons with optimum defocus. This specimen is placed at the Fourier image distance of 332 Å from an Au[001] crystal multiple atomic focuser. The exit wave from the focuser is calculated and then Fourier transformed to give the intensity distribution in the Fourier image formed at infinity which should contain the image of the specimen.

Figure 13B:
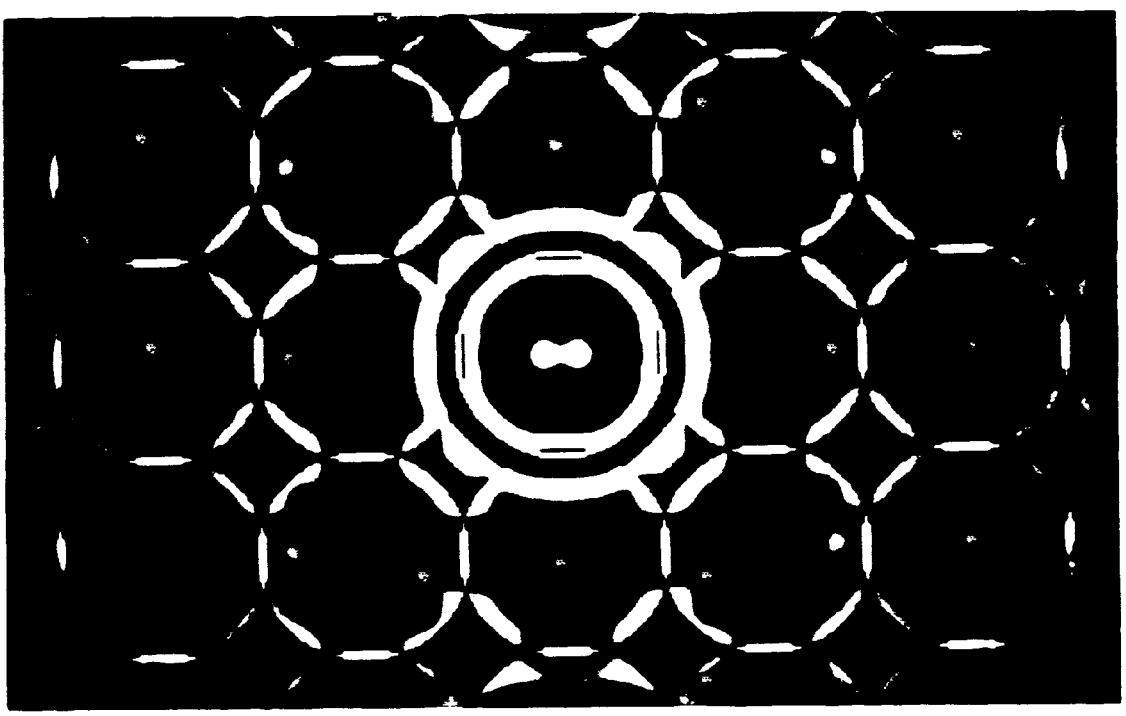
FIG. 13(b) is a STEM image of two AU atoms (Scheme 4).

The result of this calculation is given in FIG. 13(*b*) for an objective aperture radius of 6.5 mrad. The image of the two gold atoms is seen with good contrast at the center of the image in a region of uniform background of diameter approximately 2 Å. Outside of this region the intensity distribution is complicated in a way that can be understood from the consideration of the other factors in the above equations. The modulation of the intensity by the T$^*$(y/Rl) term in (22) gives a reversal of phase with increasing |y| which is evident because the image of the two atoms appears with a contrast which reverses with increasing radius. The intensity term, (21), was said to be a CBED pattern of the crystal multiple focuser and this can be seen as the set of slightly overlapping disks in the background of FIG. 13(*b*). If a larger objective aperture size is used in the simulation the overlapping of the disks is greater. The areas of overlap are more prominent and tend to dominate the intensity distribution and also decrease the area of nearly constant intensity around the central image of the two atoms.

6. A Combined STEM-TEM System with a Crystal Multiple-focuser (Scheme 5)

If a thin specimen, illuminated as in a TEM, is followed by a very thin crystal consisting of one or more layers of atoms at a distance of 1 or 2 nm, each atomic focuser can form a magnified image of a small region of the specimen on some following plane. The resolution of each of these images, referred to the specimen plane, will be the resolution of the atomic focuser, namely 0.05 nm or less. If the magnification of the atomic focusers is by a factor of 10, for example, there will be no loss of resolved detail if the images are then further magnified by use of a standard TEM having a resolution of better than about 0.5 nm.

The multiple images formed by the individual atomic focusers of the two-dimensional array will overlap by a large factor, determined by the atom-lens magnification. This overlap can be avoided if these images are formed and further magnified and recorded serially. This may be done with the scheme illustrated in FIG. 6.

The specimen is illuminated by the focused beam from a STEM instrument which forms a probe so small, about 0.2 nm in diameter, that it illuminates only one of the atomic focusers in the array at a time. While the STEM beam is focused on the one small part of the specimen in front of the one atomic focuser, a single magnified image is formed and further magnified by the TEM, and recorded by use of a CCD camera or on a photographic plate or, preferably, an Image Plate. The STEM probe is then moved successively to the regions of the specimen which lie ahead of all the desired members of the atomic focuser array in turn, preferably by use of an appropriately adjusted digital deflection system. For each STEM probe position, the final TEM-magnified image is recorded separately. This separate recording may be made by recording with a CCD camera for each point. Alternatively, the many separated images may be recorded on a single photographic plate or Image Plate by deflecting the images with scan coils synchronized with those of the STEM instrument.

For example, in the case that the crystal multiple-focuser is made of a gold [001] crystal, with spacings of 0.2 nm, each area of the specimen separately imaged has a diameter of about 0.2 nm and the atom-lens magnifies it to a diameter of 2 nm. For a TEM magnification of 10$^6$, the final image has a diameter of 2 mm. As the STEM probe is moved to the adjacent atomic focuser, 0.2 nm away, a deflector system in the TEM moves the image recording point by a distance of 2 mm or greater. On a photographic plate or Image Plate of the size commonly used, an array of possibly 50×50 such images could be recorded. These images would then be recorded, inverted and patched together to give an image of a specimen region of diameter 10 nm with a resolution of better than 0.05 nm.

The main experimental difficulties for this scheme include that of attaching the specimen firmly to the crystal multiple-lens with a spacing between them of 1 or 2 nm, and the avoidance of drift or mechanical instability of this specimen-lens assembly. The requirements for the electron-optical performance of the STEM and TEM instruments come well within the capabilities of the currently available instruments.

One interesting aspect is that the imaging by the combined atomic focuser and TEM will not be degraded by the convergence of the incident beam from the STEM system since, for a probe formed with a coherent convergent beam, the phase of the incident wave across the focus of the probe is a constant for most of the diameter of the intensity maximum, i.e., the specimen area will, in effect, be illuminated by a coherent plane wave; see FIG. 9.

Figure 6:
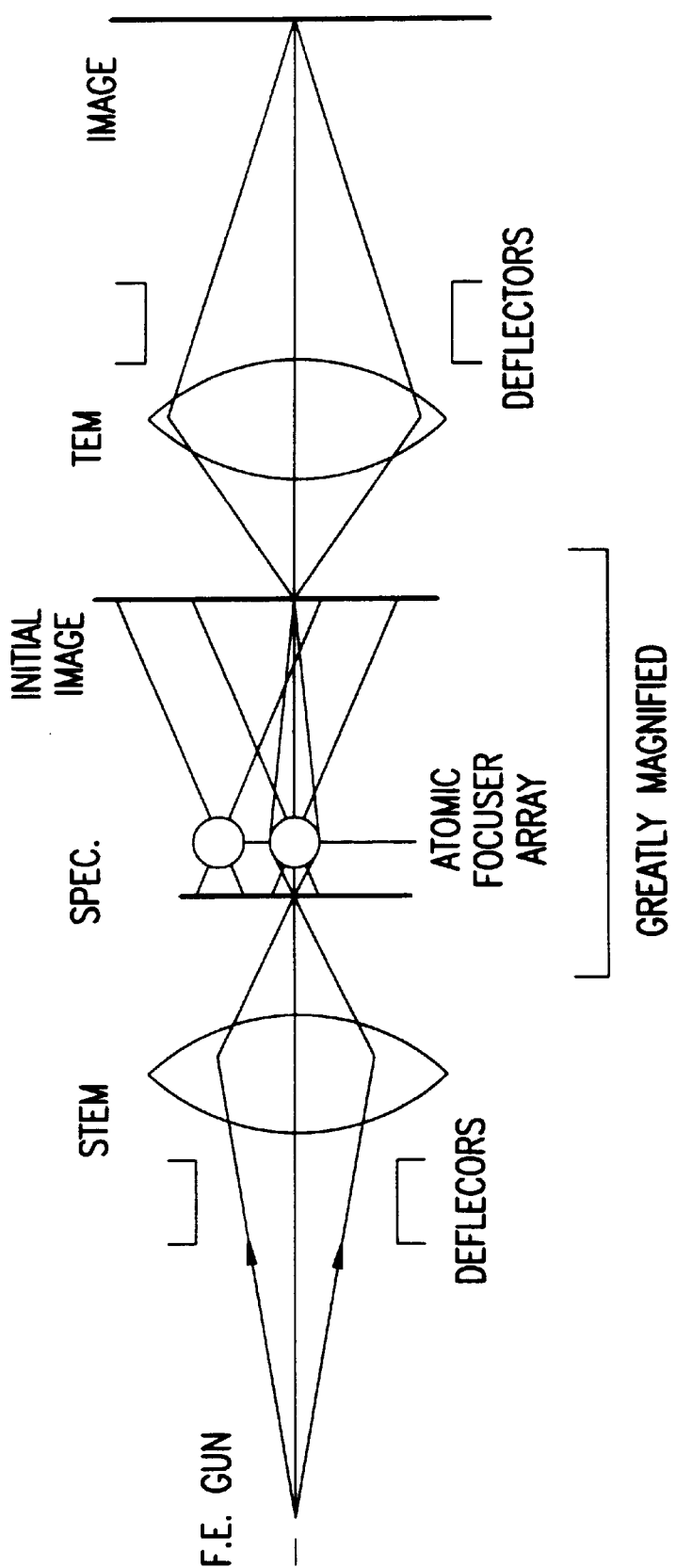
FIG. 6 is a diagrammatic illustration of a crystal multiple focuser for a STEM-TEM in accordance with Scheme 5.

By application of the reciprocity principle it is possible to describe a complementary imaging mode in which the direction of propagation of the electrons in FIG. 6 is reversed so that the electrons are generated at the right side of the diagram and proceed towards the left (Scheme 6). A field emission gun in the image plane of the TEM produces a cross-over in the objective lens focal plane of diameter less than about 0.5 nm. This is scanned over an area of perhaps 2 nm diameter. Each atomic focuser in the two-dimensional array then gives a reduced image of a beam 0.05 nm in diameter scanned over an area of 0.2 nm diameter. What was the STEM instrument on the left-hand-side now serves as a TEM instrument to give a magnified image of all these micro-images. Since this TEM can have a resolution of no better than about 0.2 nm, the final magnified image must be recorded separately for each position of the set of beams focused on the specimen, i.e., for each of the scan points that are produced by the scan in the original, right-hand-side effective STEM instrument. For a reduction of resolution from 0.2 to 0.05 nm, for example, this would entail the recording and correlation of about 16 separate images.

EXAMPLES

The following examples present possible theoretical and model simulations of invention as described herein. These examples however are not meant to limit the extent of the invention.

Example 1

Imaging Properties of Atomic Focusers (Schemes 2 and 5)

For a single atomic-focuser TEM system, such as illustrated in FIG. 2, it is not to be expected that the diameter of the field of view will be much greater than the diameter of the focuser. Some translation of the specimen relative to the atomic focuser by means of a STM-type manipulator is necessary in order to allow a useful specimen area to be imaged. The determination of the effective field of view of the focuser is required to indicate the scale and accuracy of the translations that are needed and the number of translations required to cover a desired specimen area.

For the arrangement shown in FIG. 6 (Scheme 5), a crystal multiple focuser is used. The focused beam from a high-resolution STEM instrument is deflected to illuminate, in turn, each of the small areas of the specimen which are imaged by the separate rows of atoms passing through the crystal. Each atomic row forms an image magnified many times which can then be magnified further by a normal-type TEM system having only moderate resolution. The aberrations and incoherent resolution-limiting factors of this TEM system then have negligible effect on the final image resolution. The magnified images produced by the separate atomic rows would overlap severely but, since they are formed separately in time, they can be separated in space by use of a deflector system in the TEM column coupled with that in the STEM instrument. In this way, an ultra-high resolution image of an extended specimen area may be acquired with no movement of the specimen relative to the crystal focuser, provided that the diameter of the field of view of each atomic focuser is equal to, or greater than, the separation of the atomic rows in the crystal.

For an initial assessment of the paraxial imaging effects of crystal focusers, models were made of thin crystals of gold in [001] and [111] orientations. Then the Au[001] orientation was chosen to test the imaging properties. The electron energy in each case was 200 keV.

Specimens were placed at distances of 1–7 nm in front of the focuser crystal. In order to avoid complications due to the overlapping of images from adjacent atomic rows in the crystal, the incident beam was modulated by a gaussian function having an intensity profile with a full-width at half maximum of either 0.12 or 0.14 nm. Such a gaussian function, of constant phase, provides a convenient approximation to the illumination by the focussed beam of a STEM instrument because it has been shown that, close to optimum defocus, the central maximum of the focussed probe of a STEM instrument has constant phase. Phase fluctuations occur only in the outer regions of the probe where the intensity is very low and oscillatory (J. M. Cowley, Coherent Convergent Beam Diffraction, in: Electron Diffraction Techniques, Vol. 1, J. M. Cowley, Ed., Oxford Univ. Press, 1992).

In order to provide a convenient sampling of the field of view for the imaging, a specimen was modelled on the basis of a two-dimensionally periodic array of gold atoms with interatomic spacing of 0.05 nm, such as might possibly be produced in projection of a thin gold crystal tilted away from a principal-axis direction. For such a periodic object, however, the imaging process may be strongly influenced by the Fourier-imaging phenomenon. For the periodicity of a=0.05 nm, and for parallel illumination with 200 keV electrons, exact reproductions of the exit wave-field of the specimen appear at multiples of $2a^2/l=2$ nm in the beam direction. For odd multiples of $a^2/l=1$ nm, there is an image shifted by half the spacing, giving the appearance of a reversal of contrast for a simple periodicity. For a phase object, the contrast is very small for the in-focus position and the contrast reverses through focus. The spherical aberration constant for atomic focusers is expected to be negative as can be seen readily if the projected potential is approximated by a single Gaussian function, expanded in a power series. Hence the best images should be obtained for over-focus conditions, giving white spots for individual atoms. Thus changes, including reversals, of contrast are expected for differences of specimen-focuser distance which are smaller than 1 nm. For non-periodic objects, the contrast and resolution are expected to vary at a comparable rate but without the Fourier image repetition.

For these reasons, the model specimen was modified in two different ways. Firstly, one of the atoms of the array was removed, to simulate a vacant lattice site. It is then expected that successive Fourier images of the periodic part will show progressively weaker perturbations of the periodic image around the vacancy site (J. M. Cowley et al., Proc. Phys. Soc. London, B70 (1957), 486). Secondly, the array was randomized by adding positive or negative random numbers, having magnitudes as large as 0.012 nm, to the coordinates of the atoms. For this model, the Fourier image production should be largely eliminated.

Simulations

Figure 14A:
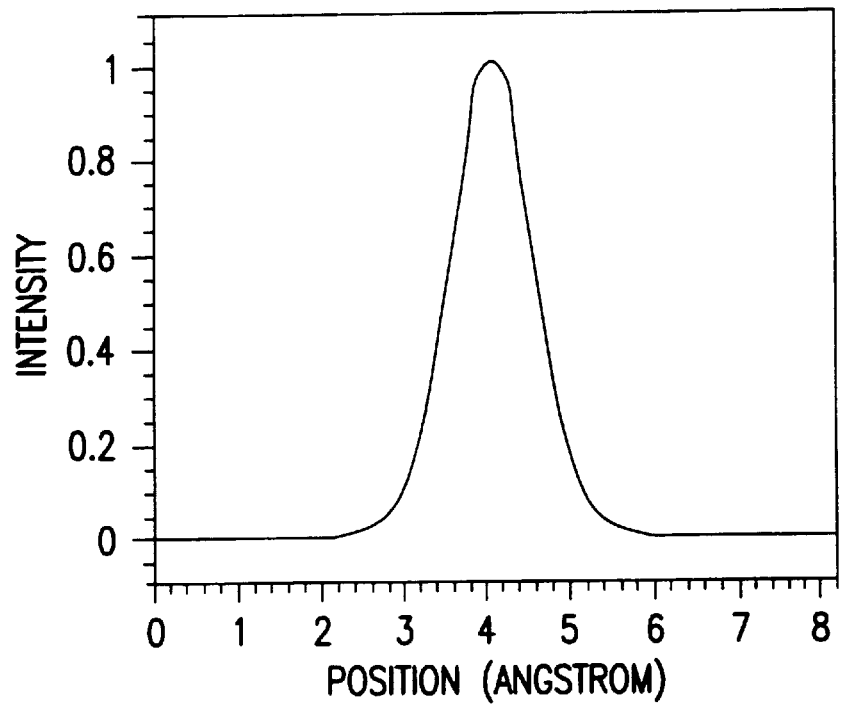
FIGS. 14(a)–14(e) are normalized intensity profiles of two-dimensional simulations of beams formed by Au[001] crystals of various thicknesses.
Figure 14B:
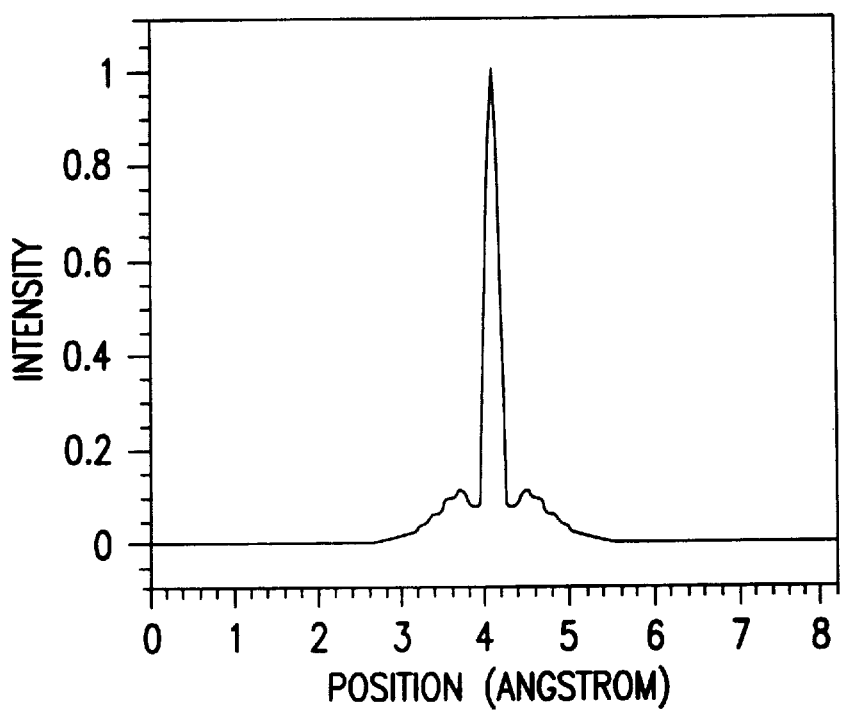
Figure 14C:
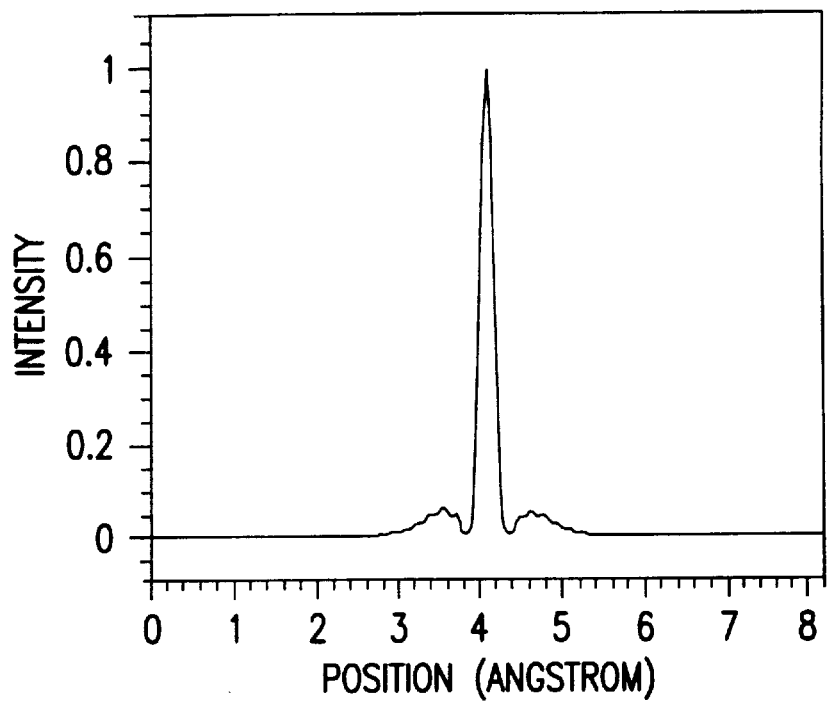
Figure 14D:
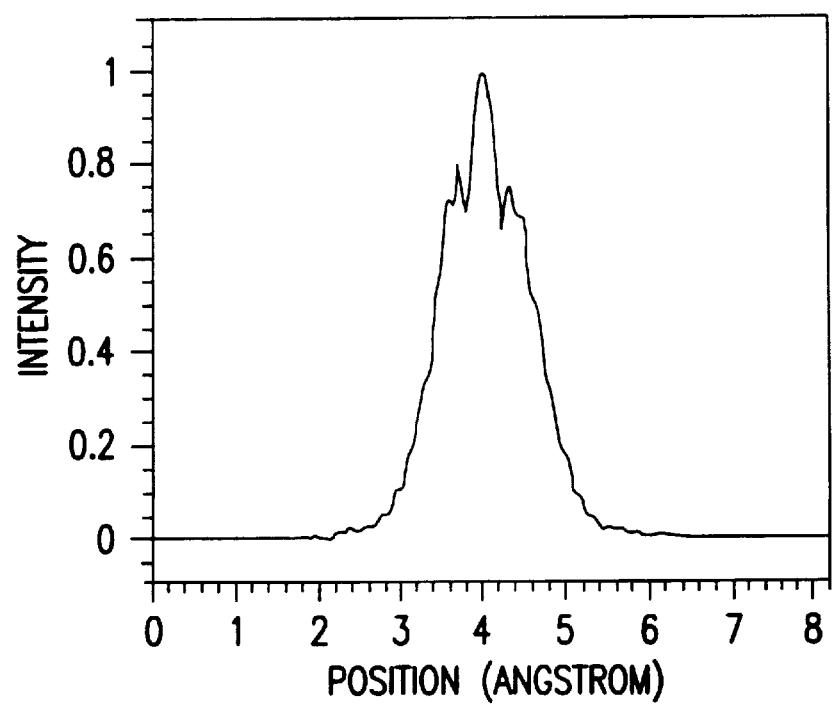
Figure 14E:
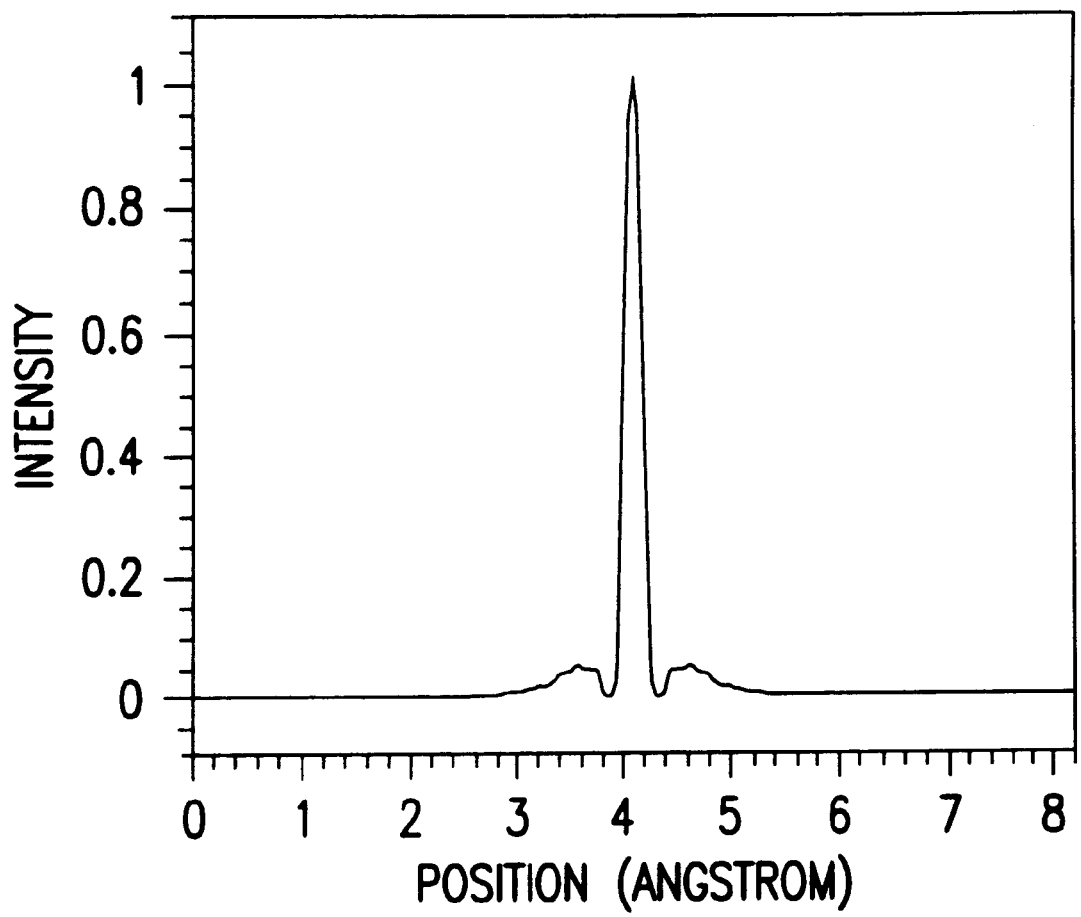

Initial simulations were made in order to confirm the focussing effect of rows of atoms in a thin crystal. Because only very thin crystals were considered, no absorption effects were included. With a plane-wave incident beam restricted by the gaussian aperture function, centered on one atom row, calculations were made of the intensity distribution in the exit face of the crystal for various crystal thicknesses. FIG. 14(a) is for an incident beam limited by a gaussian width of 0.14 nm. FIGS. 14(b)–14(e) show the intensity distributions for line scans across the centers of the peaks for an Au[001] crystal at the entrance face and at the exit face for thicknesses of 0.82, 2.04, 3.66 and 5.70 nm. It is seen that the crystal focuser produces a sharp peak of width less than 0.03 nm for thicknesses around 2 and 5 nm, but for a thickness of about 3.7 nm, the intensity peak has about the same shape and width as the incident beam.

Parallel calculations that have been made for 200 keV electrons and an Au[001] crystal with a plane wave incident (with no gaussian limitations) or for a STEM beam of diameter approximately 0.2 nm have shown beam profiles similar to those of FIGS. 14(a)–14(e) but occurring at somewhat greater thicknesses, with the periodicity of around 6 nm. The smaller periodicity introduced by the gaussian beam limitation is to be expected because, with a value of the spherical aberration constant which is negative and very much greater in magnitude than the focal length, the effective focal length of an atom is smaller for the inner part of the atom.

Figure 15:
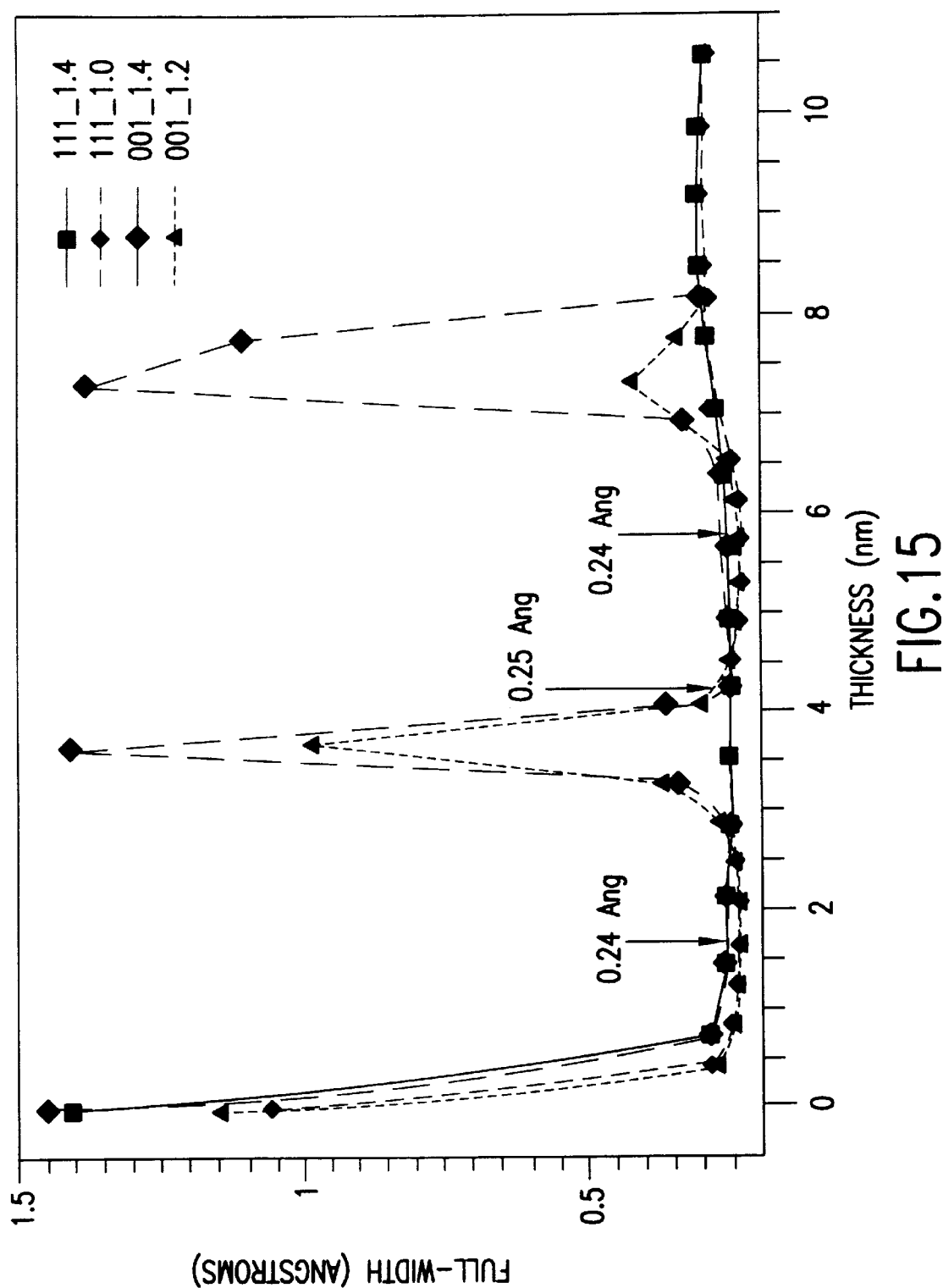
FIG. 15 is a diagram including plots of of full-widths of the beam as a function of crystal thickness for Au crystals in [001] and [111] orientations.

A periodic variation of beam diameter with crystal thickness is to be expected from the previous calculations of the transmission of STEM beams through crystals (J. Fertig et al., Optik 59 (1981), 407; J. Broeckx et al., Ultramicroscopy 60 (1995), 71; R. F. Loane et al., Acta Crystallogr. A44 (1988), 912. A more complete demonstration of this effect is given in FIG. 15 in which the diameter of the sharp peak is plotted against thickness for Au[001] with the incident beam limited by gaussians of width 0.12 and 0.14 nm and for an Au[111] crystal with the incident beam widths of 0.10 and 0.14 nm. For the Au[001] case, the beam width falls sharply with thickness at first, and reaches a minimum of 0.024 nm for a thickness of 1.8 nm. The width increases again at multiples of 3.7 nm, but the maximum width appears to decrease with each repetition of this maximum.

The Au[111] case, on the other hand, appears to be different. The beam width decreases to a minimum of about 0.025 nm and thereafter varies very little, with no apparent periodic return to the initial, broad-beam condition. The difference from the [001] case arises, presumably, from the smaller distance between atomic columns (0.166 rather than 0.2 nm) and the larger separation of the atoms in the beam direction (0.705 rather than 0.407 nm).

Simulations of the imaging of a specimen by a single-atom focuser and by one row of atoms through a crystal were made by passing the beam through the gaussian limiting function and the specimen array, propagating the resultant wave through vacuum to the atomic focuser crystal, propagation of the wave through the crystal by application of a multi-slice dynamical diffraction program and then Fourier transform of the exit wave to give the amplitude and intensity distribution in the image plane at infinity. These operations were performed using the EMS programs from P. A. Stadelmann, array size 256×256, with the Indigo workstation on a Silicon Graphics computer.

For the specimen consisting of the array of Au atoms with periodicity 0.05 nm, with one atom removed, and a crystal focuser consisting of an Au[001] crystal with a thickness of one unit cell (0.407 nm), the image simulations are shown in FIG. 17, showing the projected potential distribution of the specimen, limited by the gaussian of width 0.14 nm. FIG. 17 includes the images formed for specimen-crystal distances from 1.4 to 7.3 nm.

In general, it is seen that images showing the array of gold atoms are visible out to a radius of at least 0.14 nm. The gold atoms are clearly resolved with a contrast that reverses for a specimen-focuser separation of about 2.3 nm. At the center of each image there is a bright spot of diameter about 0.03 nm. This spot presumably arises from a plane-wave background to the wavefunction at the exit face of the focuser and represents the transmission of the "unscattered" beam through the crystal The contrast of the gold atoms of the specimen is greatest for specimen-focuser separations somewhat greater than the in-focus distance of 2.3 nm, i.e., for an overfocus of the focuser, where the atoms appear as white dots. For separations of greater than 4 nm, the contrast is poor, except that at about 7 nm a good, contrasty image of the periodic part of the specimen is formed, corresponding to a Fourier image. The decrease in magnification corresponding to the greater specimen-focuser separation is obvious. In this Fourier image, the presence of the missing atom in the specimen is indicated only by a slight asymmetry of the over-all intensity distribution. The missing atom position is clearly indicated for the images closer to focus by a reduction of contrast relative to the atom positions, but the contrast at this position is not zero except very close to focus. No appreciable distortion of the image is observable. The image characteristics were not affected by a lateral shift of the specimen.

Figure 18A:
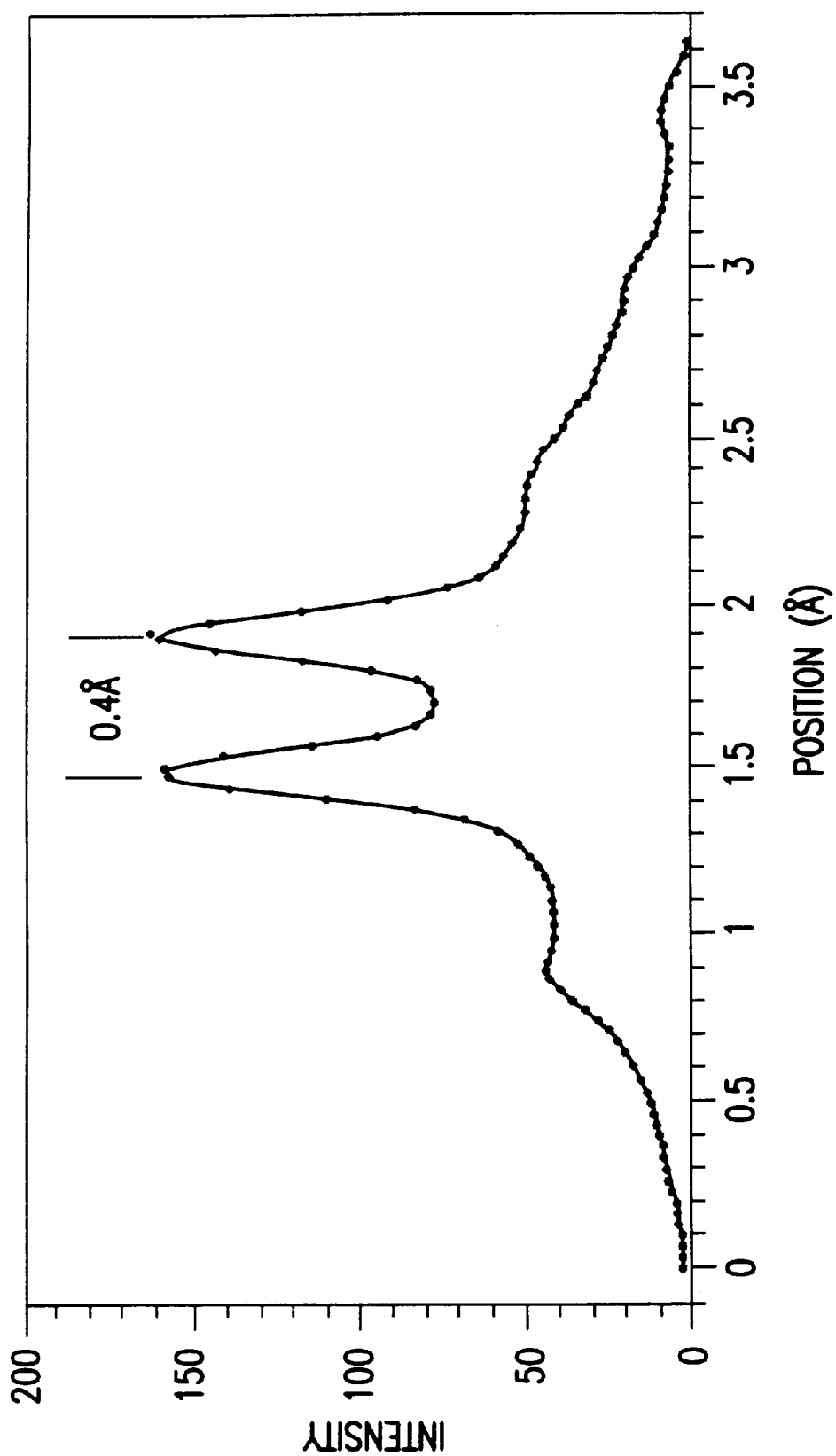
FIGS. 18(a)–18(c) are intensity profiles along the line of scan of FIGS. 17(c) and 17(d). The arrows indicate the atom positions, 0.04 nm apart (Scheme 5).
Figure 18B:
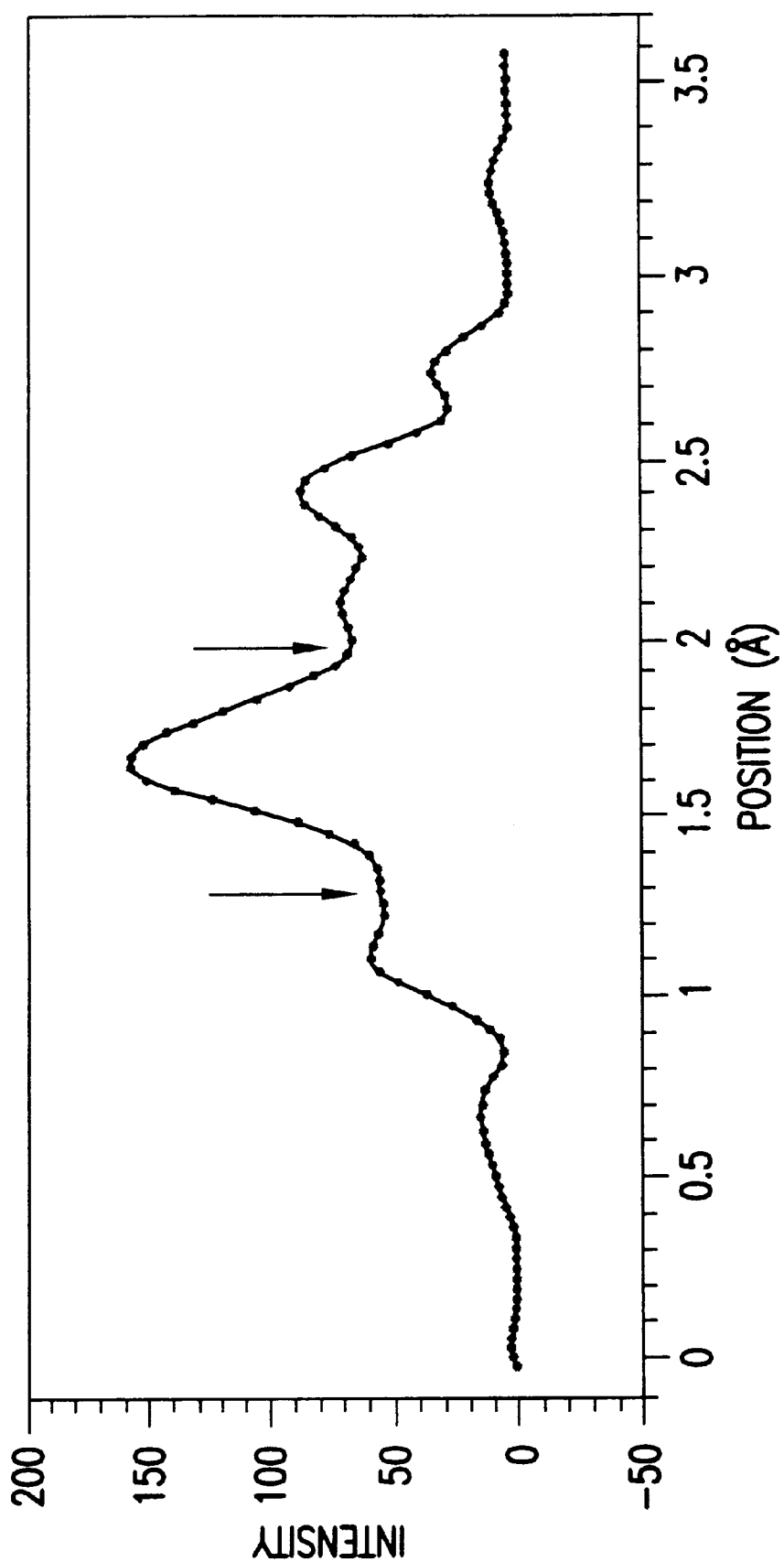
Figure 18C:
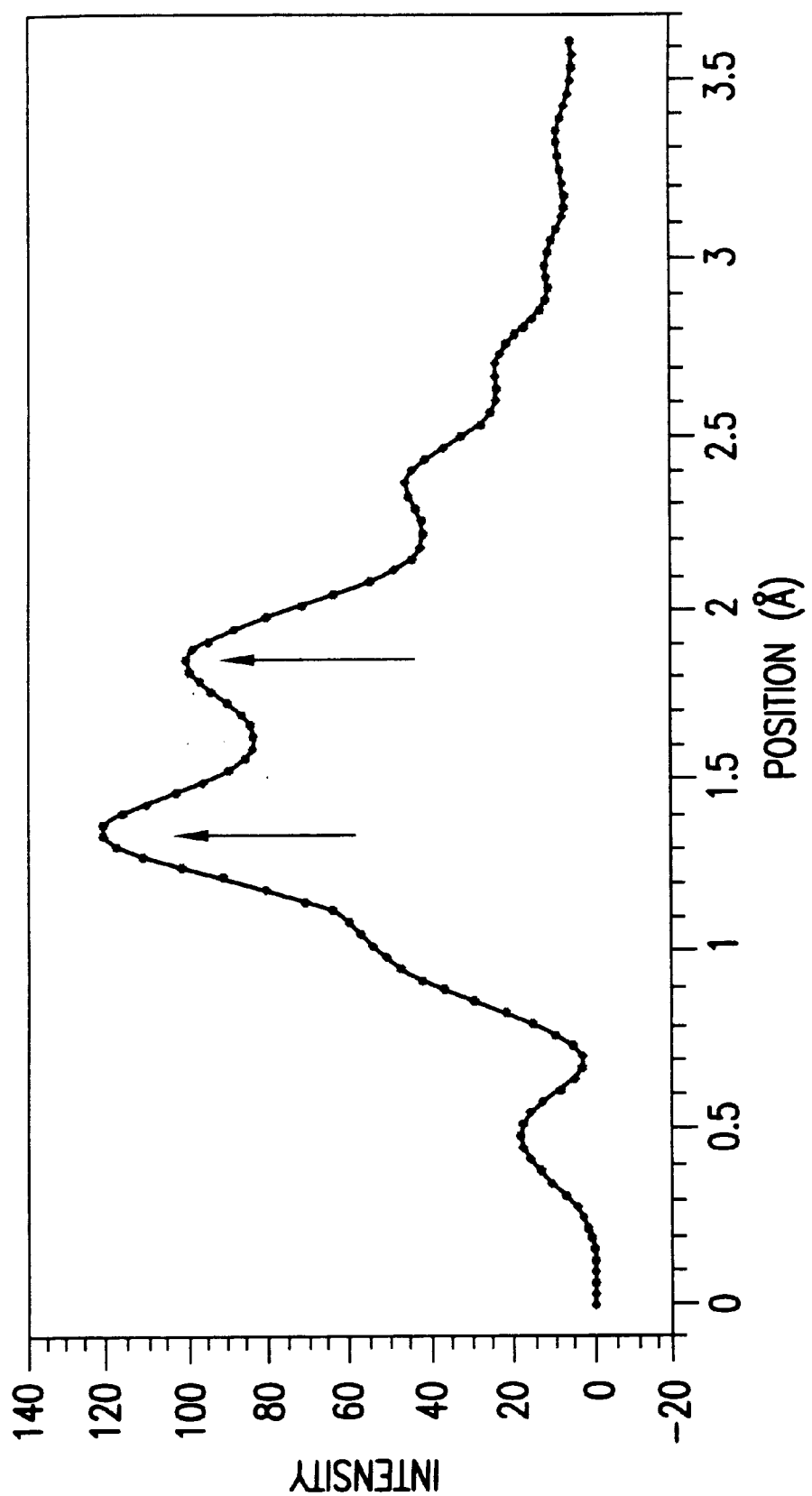
Figure 19A:
FIGS. 19(a)–19(d) are simulated images for various crystal thicknesses, 0.4. 0.8, 1.2, and 1.6 nm, with separations of 1.6, 1.4, 1.2 and 0.8 nm, respectively (Scheme 5).
Figure 19B:
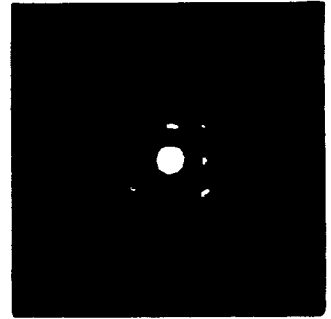
Figure 19C:
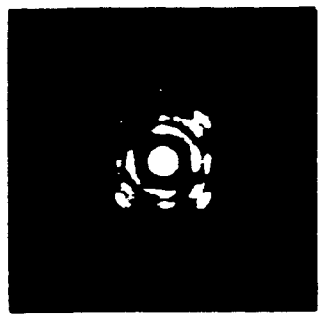
Figure 19D:
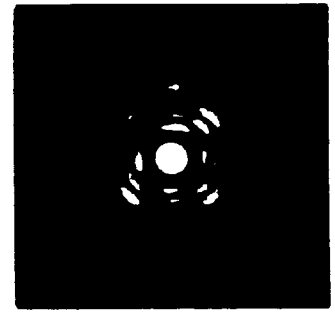

For the randomized model of the specimen, the projected potential of one portion is shown in FIG. 17, showing images formed by a single-atom thick focuser, underfocus and overfocus. A line-scan across two neighboring atom positions is indicated in FIG. 17 and the intensities along this line are shown in FIG. 18. The intensity profiles are dominated by the gaussian background which affects the apparent atom positions but the two atoms, 0.04 nm apart are seen to be clearly resolved in the images. The contrast of the images for the randomized model decreases rapidly for a specimen-focuser separation greater than 2.5 nm. and there is no visible Fourier-image repetition.

For increasing thickness of the crystal focuser, the contrast of the image decreases rapidly and the field of view decreases slightly for a fixed specimen-focuser separation of 1.6 nm. However, it became evident that the optimum focal length of the focuser decreases as the thickness of the crystal increases, to a value of 0.8 nm or less for the optimum crystal thickness, as suggested by FIG. 15, of about 1.6 nm. FIG. 19 shows images calculated for crystal thicknesses of 0.4 to 1.6 nm and specimen-focuser separations decreasing from 1.6 to 0.8 nm. Apart from some interference effects seemingly associated with the central bright spot (and thereby constituting an artefact), all these images show the clear bright-spot contrast of the specimen atoms, well resolved, with very little contrast at the missing-atom position. The atom images are visible out to a radius of 0.14 nm from the center. There is no obvious improvement of resolution with crystal thickness.

Example 2

Simulations for Imaging with Atomic Focusers

The simulations have been made with multislice algorithms written in the Semper image processing language (Saxton et al., Ultramicroscopy 4 (1979), 343–350) on a Silicon Graphics workstation.

Imaging in the TEM Fourier-Image Mode (Scheme 3)

A specimen is placed at a Fourier image distance beyond a crystal, which serves as a periodic multiple atomic focuser, illuminated by a plane wave, and a TEM instrument is used to image the exit wave from the specimen, as suggested in FIG. 3. The Fourier image of the periodic array of fine cross-overs formed at the exit face of the crystal may be scanned over the specimen by tilting the incident beam, and for each beam tilt a TEM image is recorded. From the resulting series of TEM images it is then possible to derive an image of the specimen with a resolution corresponding to the width of the fine probes formed by each atomic focuser.

For a specimen consisting of two gold atoms, 0.05 nm apart, placed at the first Fourier image distance of 33.2 nm beyond a crystal multiple focuser, consisting of an Au[001] crystal of the optimum thickness of 2.8 nm, it is possible to derive an image in which the two gold atoms are clearly resolved with high contrast. In this simulation, the TEM instrument was assumed to have a resolution of 0.2 nm. Ultra-high resolution imaging by this method may be applied to specimens of area limited only by the extent of the atomic-focuser crystal and by the memory size of the computer used for correlation of the multiple TEM images.

Figure 20A:
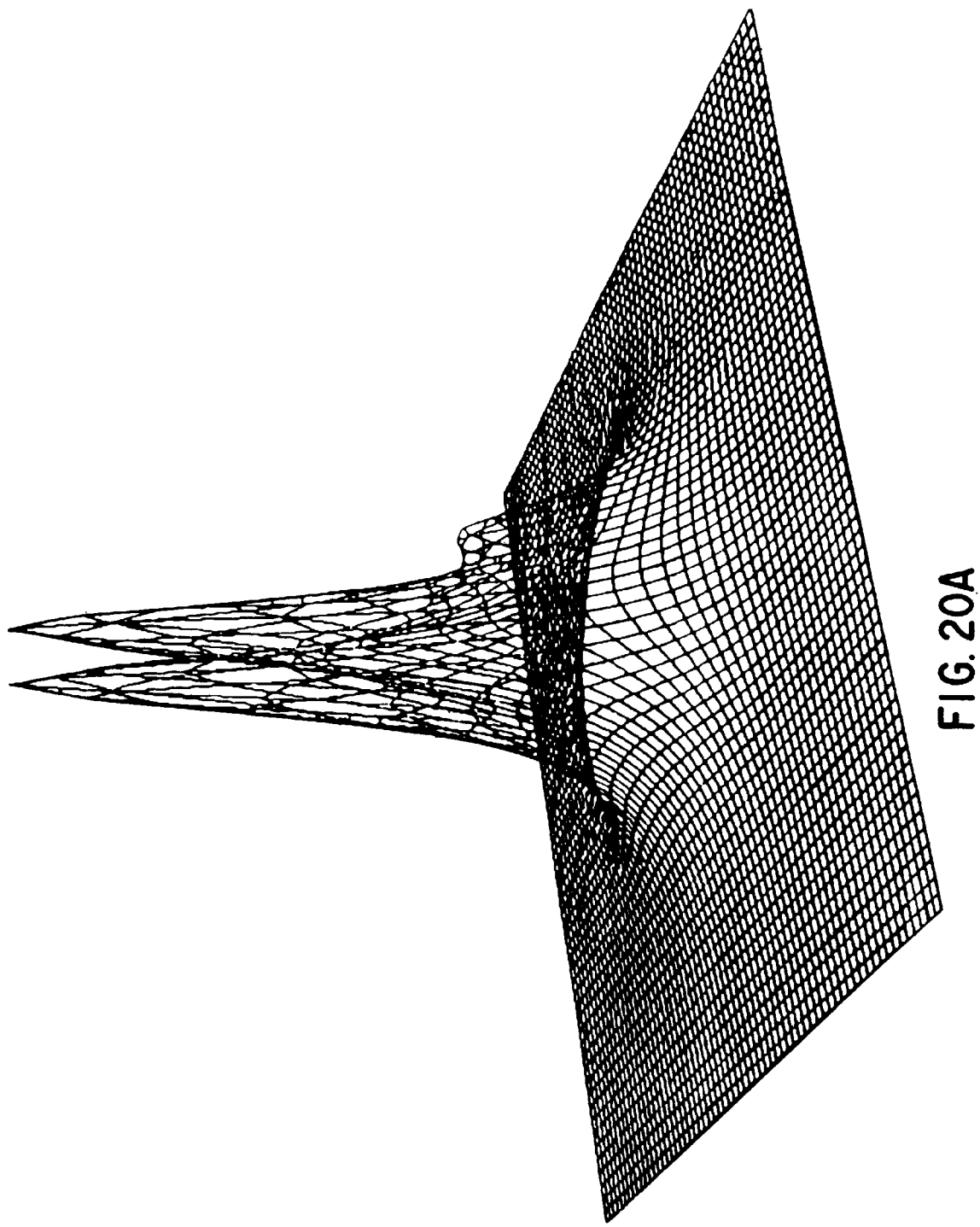
FIG. 20(a) is a projected potential image for a specimen consisting of two Au atoms 0.05 nm apart plus a Si atom 0.05 nm from one of the AU atoms.
Figure 20B:
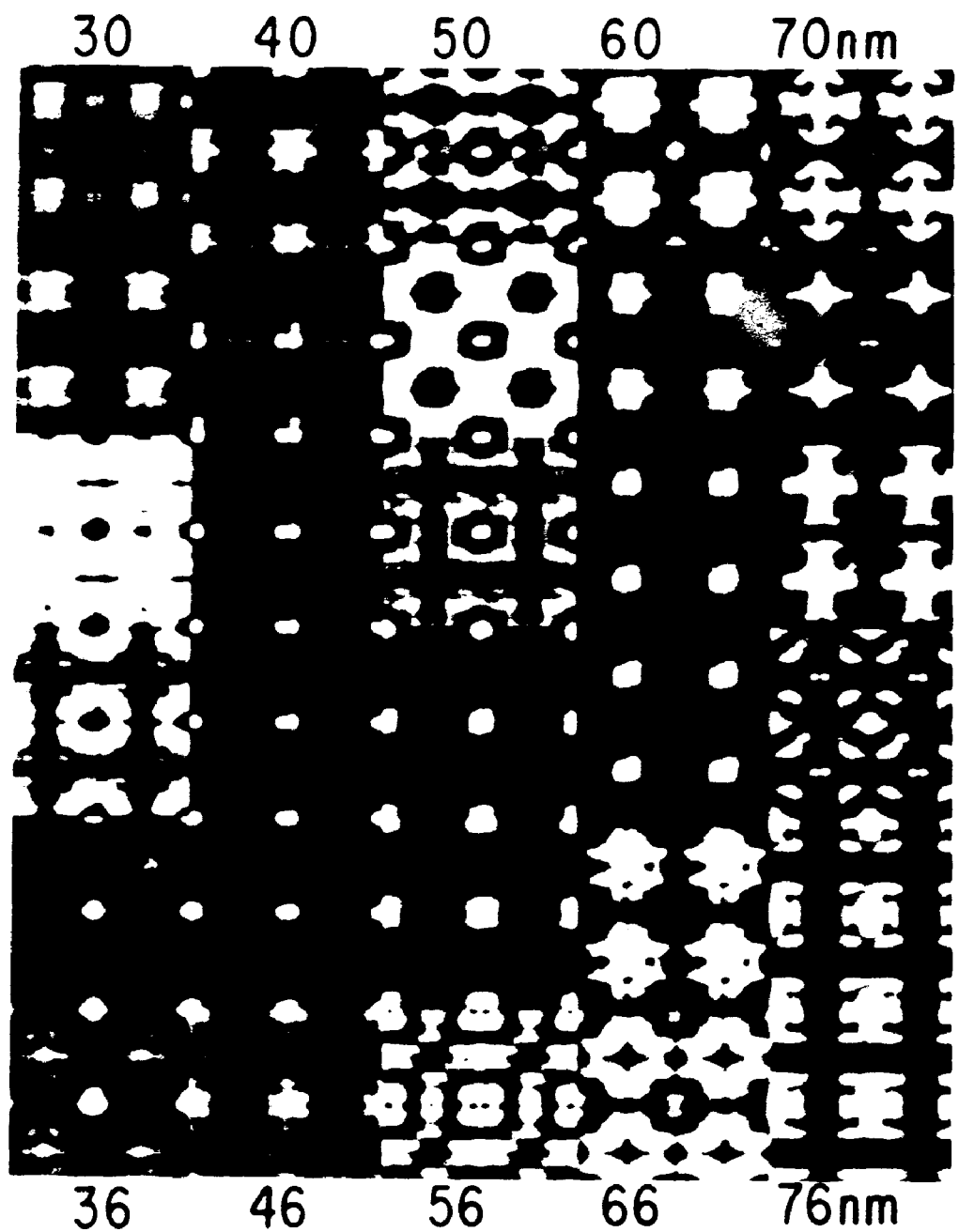
FIG. 20(b) is an ultra-high resolution image of the specimen of FIG. 20(a) derived from the set of images formed by use of Scheme 3 for various indicated values of the defocus (1 nm apart) of the TEM instrument.

A further simulation for a specimen consisting of two gold atoms and a silicon atom placed at the vertices of a right-angle isosceles triangle with Au-Au and Au-Si separations of 0.05 nm was performed. For convenience, this specimen is assumed to be periodic, with the array of three atoms repeated with the periodicity of the projected gold lattice. The TEM instrument is assumed to have Cs=1 mm and an objective aperture of 40 mrad. for 200 keV electrons, giving a nominal bright-field resolution of about 0.23 nm. Images have been calculated for various defocus values of the TEM instrument. FIG. 20(a) shows the projected potential distribution for this group of atoms. It is seen that although the gold atoms are clearly separated in this projection, the silicon atom appears as only a small bump on the side of a gold atom, not clearly separated. FIG. 20(b) shows a selection of images from a defocus series with differences of 1 nm between defocus values. Each image, 0.407×0.407 nm, is formed by correlating a set of 65×65 TEM images obtained with tilts of the incident beam in the range of ±6 mrad. Because, in this case, the specimen is assumed to be periodic, the images recur for the differences in defocus corresponding to the Fourier image distance of 33.2 nm, and at the half Fourier image spacings, 16.6 nm, the images appear at the positions shifted by half an image periodicity in each direction.

Around −42 nm defocus, the image shows the two gold atoms as bright spots, clearly resolved, and the image of the silicon atom is a weak extension of the peak of the right-hand gold atom, as might be expected from the projected potential distribution of FIG. 20(a). The half-Fourier images, with the images of the atoms displaced to surround the center positions of the periodic image cell, are seen at about 30 and 62 nm defocus.

From the foregoing it becomes readily apparent new and useful atomic focuser devices and methods have been herein described and illustrated. It is of course understood that such modifications, alterations and adaptations as will readily occur to one skilled in the art confronted with this disclosure are intended within the scope of the invention.

It has been demonstrated by means of five examples of possible systems, that the resolutions of electron microscopes may be improved from the current limit of between 0.1 and 0.2 nm, to 0.05 nm or less by the use of single-atom atomic focusers or single crystal multiple focusers.

For the achievement of this resolution improvement, it is not necessary to build a new type of electron microscope. Any of the existing high-resolution electron microscopes having sufficient mechanical and electrical stability, and preferably equipped with a field-emission gun, may be used with relatively minor modifications of the specimen-handling and data-processing capabilities. Except in the case of the fifth scheme, the greatest modification of such an electron microscope that might be contemplated is the incorporation of a STM-type piezoelectric system for the manipulation of the specimen or of the atomic focusers. For the single crystal multiple-focusers, this modification would not be required, but provision is needed for the recording and processing of the data from series of images recorded either sequentially or simultaneously with multiple detectors. In all cases, some problems exist for the preparation and mounting of suitable specimens.

The feasibilty of such arrangements has been amply established by theoretical analysis and by computer simulations. For the first of these arrangements, in which only one part of the specimen at a time is irradiated by a reduced cross-over produced by an atomic focuser, secondary radiation signals or electron energy loss signals could be used to provide additional information regarding the irradiated area and could be used to form scanning images of the specimen. The detection of characteristic X-rays could give chemical analysis of selected areas or a mapping of the distribution of particular elements in the specimen with high spatial resolution than that achievable with a normal STEM instrument. This may be done for specimens in the form of thin films or for bulk specimens. Similar chemical analysis or element-mapping could be performed by making use of the energy-loss peaks obtained with an electron energy-loss spectrometer in the case of electrons transmitted through thin films. The detection of back-scattered electrons, low-energy secondary electrons or of Auger electrons may give information on surface morphology or on the chemical compositions of surfaces with very high spatial resolution for bulk- or thin-film-specimens, in extension of the results already obtained in an appropriately-equipped ultra-high vacuum STEM instrument as described in "Biassed Secondary Electron Imaging in a UHV-STEM," 31 Ultramicroscopy 111 (1989) incorporated herein by reference.

What is claimed is:

1. An electrostatic lens device comprising a fixed atom or linear atom array for placement at a focal plane of an electron beam having a diameter of less than about 0.2 nm at the focal plane.

2. The device according to claim 1, wherein the fixed atom or atom array comprises an atom having atomic number greater than about 20.

3. An ultra-high resolution microscope comprising:
   an electron beam generator for generating an electron beam having an energy greater than about 50 keV and having a focal plane;
   an electron beam focuser for focusing the electron beam to less than about 0.2 nm at the focal plane;
   an electrostatic lens comprising a fixed atom or atom array disposed at the focal plane;
   a sample holder for holding a sample in the electron beam after the electrostatic lens;
   a distance adjuster device for adjusting the distance between the sample and the electrostatic lens; and
   a detector disposed after the sample holder.

4. The microscope according to claim 3, wherein the distance adjuster device comprises a piezoelectric translator.

5. An ultra-high resolution microscope comprising:
   an electron beam generator for generating an electron beam having an energy greater than about 50 keV, disposed for illuminating a sample;
   an electrostatic lens comprising an atom or linear array of atoms aligned in an incident beam direction;
   a distance adjuster device for adjusting the distance between the sample and the electrostatic lens; and
   a dectector having a resolution limit not exceeding about 0.2 nm.

6. The microscope according to claim 5, wherein the distance adjuster device comprises a piezoelectric translator.

7. An ultra-high resolution microscope comprising:
   an electron beam generator for generating an electron beam having an energy greater than about 50 keV and a divergence of less than about 1 mrad;
   a thin crystal as a two-dimensionally periodic electrostatic focuser;
   a sample holder for holding a sample in the electron beam at a Fourier image distance from the periodic electrostatic lens;

means for varying Fourier-image position of the periodic electrostatic lens relative to the sample; and a detector device having a resolution limit not greater than about 0.2 nm.

8. The microscope according to claim 7, wherein the varying means comprises means for tilting the beam relative to the focuser.

9. The microscope according to claim 8, wherein the tilting means comprises, at least one of an electromagnetic deflection coil and electrostatic deflection plates.

10. The microscope of claim 7, wherein the varying means comprises means for adjusting electron-beam wavelength.

11. An ultra-high resolution microscope comprising:

an electron beam generator for generating an electron beam having an energy greater than about 50 keV;

an electron beam focuser for focusing the beam to a diameter less than about 0.2 nm at a focal plane;

a sample holder for holding a sample in the electron beam at the focal plane;

a thin single crystal as a two-dimensionally periodic electrostatic focuser for placement at a distance from the sample equal to a Fourier image distance for the periodic focuser, and a two-dimensional detector or detector array for detecting electron beam after it has passed through the periodic electrostatic focuser.

12. An ultra-high resolution microscope comprising:

an electron beam generator for generating an electron beam having an energy greater than about 50 keV;

an electron beam focuser for focusing the beam to less than about 0.2 nm diameter at a focal plane;

a device for laterally scanning the beam at the focal plane in two dimensions;

a sample holder for holding a sample in the focal plane;

a thin crystal as a two-dimensionally periodic array of electron focusers; and a detector system having a resolution limit which is greater than 0.2 nm.

13. The microscope according to claim 12, wherein the detector system has a resolution which is less than or equal to 10 nm.

14. An ultra-high resolution microscope comprising:

an electron beam generator for generating an electron beam of energy greater than about 50 keV;

an electron beam focuser for focusing the electron beam to a diameter of less than about 1 nm at a focal plane;

a device for scanning the beam at the focal plane in two dimensions;

a thin crystal as a two-dimensionally periodic focuser array of electrostatic lenses;

a sample holder for holding a sample within a distance of a few nanometers after the focuser array; and a detector system having a resolution limit not greater than a bout 0.2 nm.

* * * * *